(12) United States Patent
Chang et al.

(10) Patent No.: US 12,356,745 B2
(45) Date of Patent: Jul. 8, 2025

(54) OPTICAL DEVICE

(71) Applicant: VisEra Technologies Company Ltd., Hsin-Chu (TW)

(72) Inventors: Kai-Hao Chang, Hsin-Chu (TW); An-Li Kuo, Hsin-Chu (TW); Chun-Yuan Wang, Hsin-Chu (TW); Shin-Hong Kuo, Hsin-Chu (TW); Po-Hsiang Wang, Hsin-Chu (TW); Zong-Ru Tu, Hsin-Chu (TW); Yu-Chi Chang, Hsin-Chu (TW); Chih-Ming Wang, Hsin-Chu (TW)

(73) Assignee: VisEra Technologies Company Ltd., Hsin-Chu (TW)

( * ) Notice: Subject to any disclaimer, the term of this patent is extended or adjusted under 35 U.S.C. 154(b) by 550 days.

(21) Appl. No.: 17/707,891

(22) Filed: Mar. 29, 2022

(65) Prior Publication Data

US 2023/0170361 A1 Jun. 1, 2023

Related U.S. Application Data

(60) Provisional application No. 63/284,511, filed on Nov. 30, 2021.

(51) Int. Cl.
*H10F 39/00* (2025.01)
*H10F 39/18* (2025.01)

(52) U.S. Cl.
CPC ....... *H10F 39/8053* (2025.01); *H10F 39/182* (2025.01)

(58) Field of Classification Search
CPC ......... H01L 27/14645; H01L 27/14647; H10F 39/8053; H10F 39/182; H10F 39/024; H10F 39/1825; H10F 39/806; H10F 39/8063; H10F 39/8067; H10F 39/807
See application file for complete search history.

(56) References Cited

U.S. PATENT DOCUMENTS

| | | | |
|---|---|---|---|
| 10,930,691 B2 * | 2/2021 | Yamazaki | H01L 27/14623 |
| 2014/0049812 A1 | 2/2014 | Palanchoke et al. | |
| 2020/0344430 A1 | 10/2020 | Wang et al. | |
| 2021/0072439 A1 | 3/2021 | Cho et al. | |

FOREIGN PATENT DOCUMENTS

| | | |
|---|---|---|
| CN | 113156564 | 7/2021 |
| JP | 2010008990 | 1/2010 |
| JP | 2012059865 | 3/2012 |
| JP | 2017076683 | 4/2017 |
| WO | 2013015117 | 1/2013 |
| WO | 2019124562 | 6/2019 |

* cited by examiner

*Primary Examiner* — Matthew L Reames
(74) *Attorney, Agent, or Firm* — LIU & LIU

(57) ABSTRACT

The optical device includes a first photodiode, a second photodiode, and a hybrid absorber. The hybrid absorber is disposed above the first photodiode and the second photodiode. The hybrid absorber includes a color filter layer and a plurality of metal-insulator-metal structures. The color filter layer includes a first color filter disposed on the first photodiode and a second color filter disposed on the second photodiode, in which the first color filter is different from the second color filter. The plurality of metal-insulator-metal structures are disposed above the first photodiode and free of disposed above the second photodiode.

14 Claims, 19 Drawing Sheets

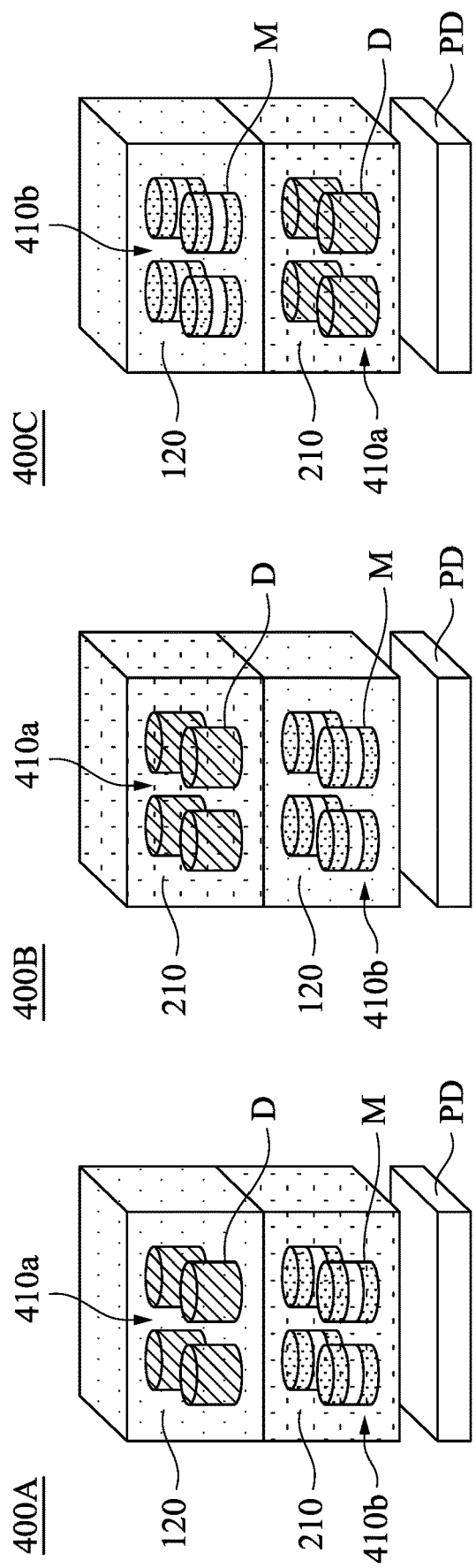

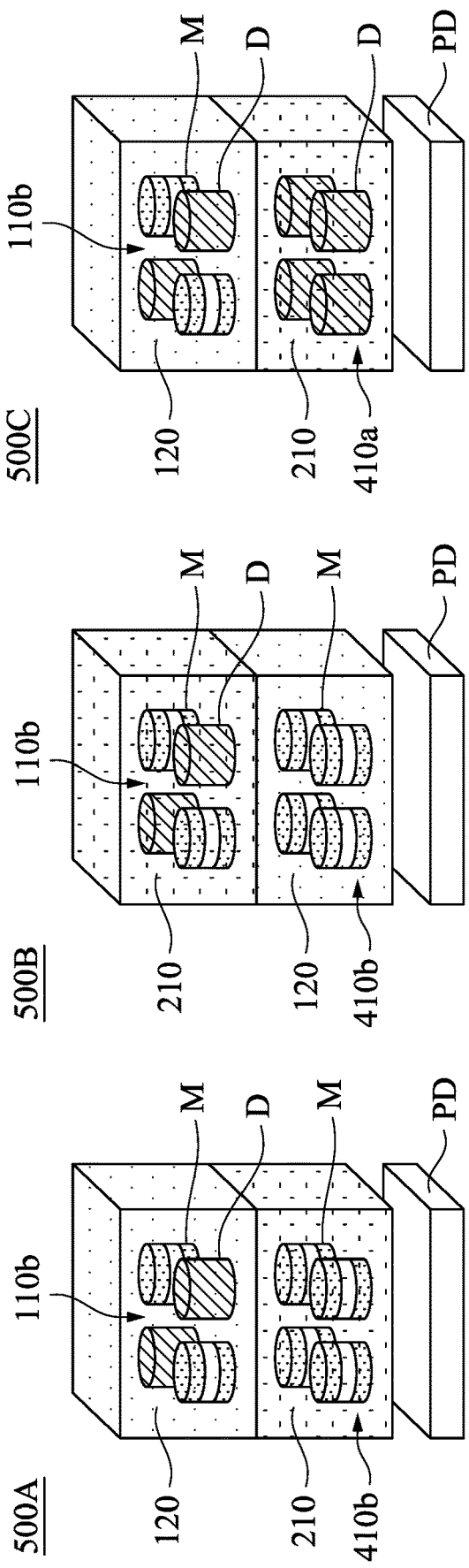

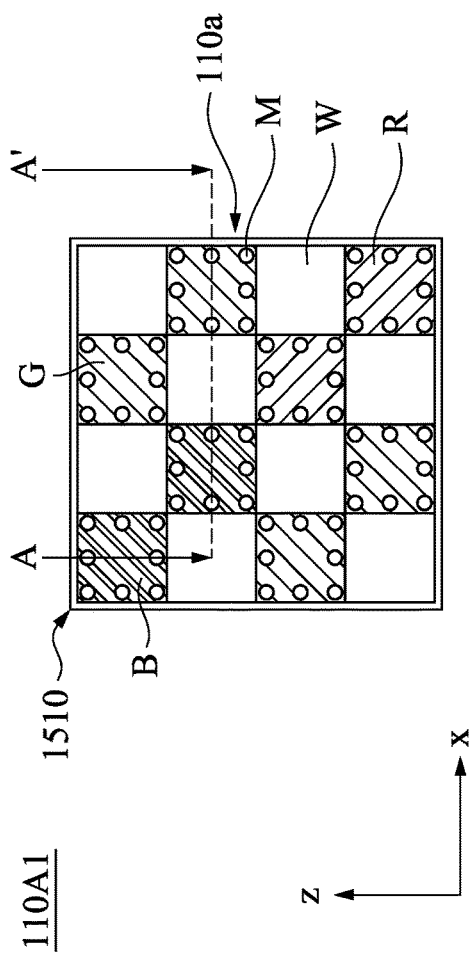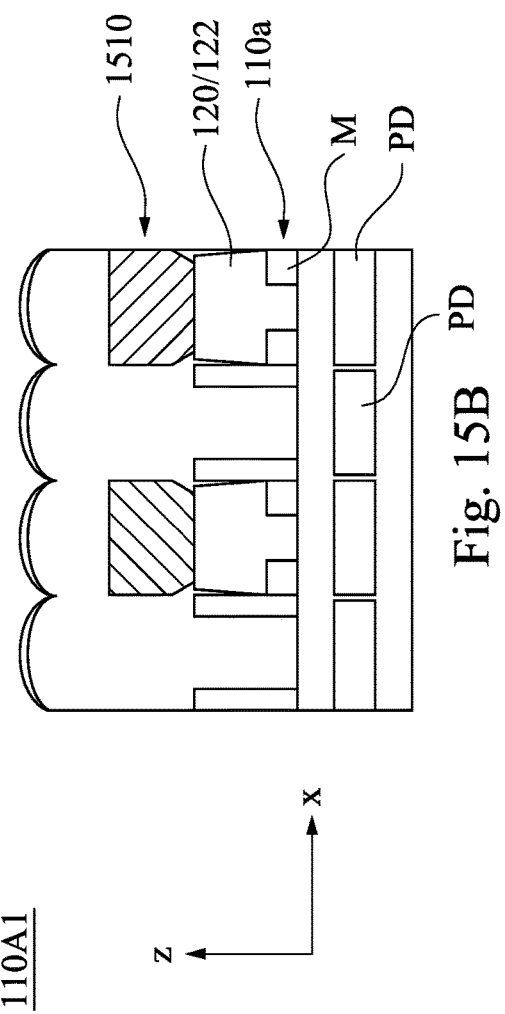

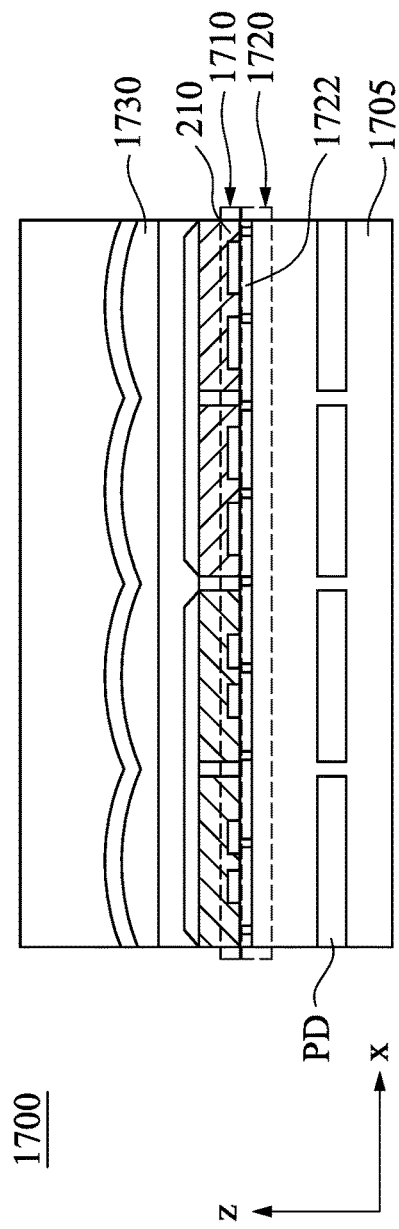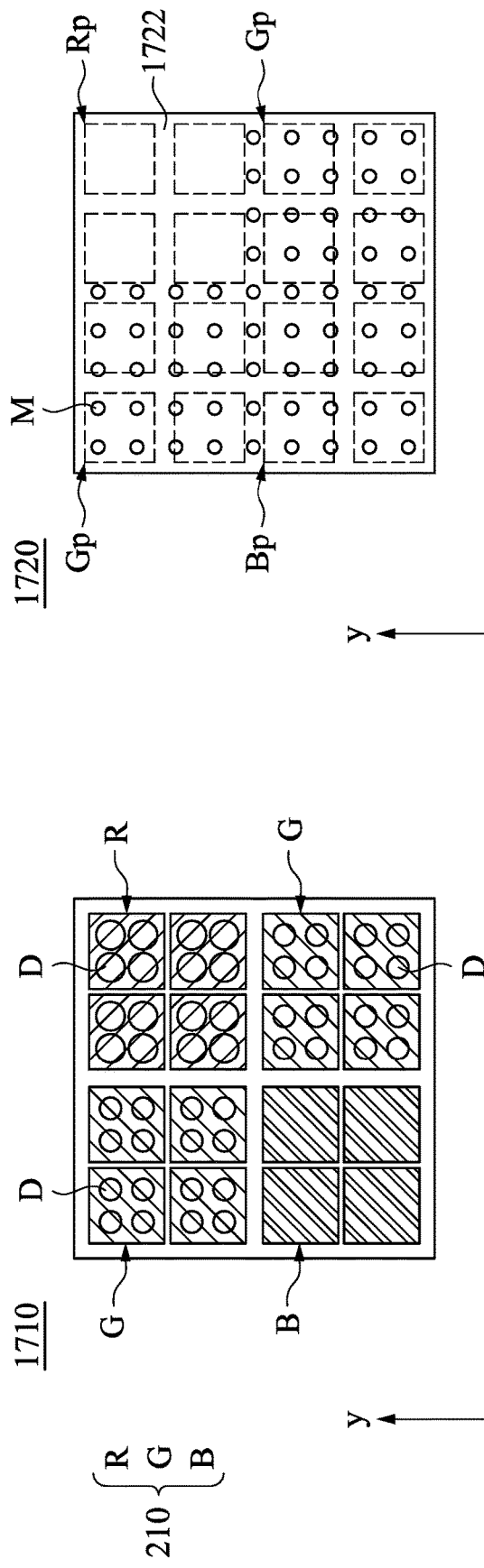
Fig. 17A
Fig. 17B
Fig. 17C

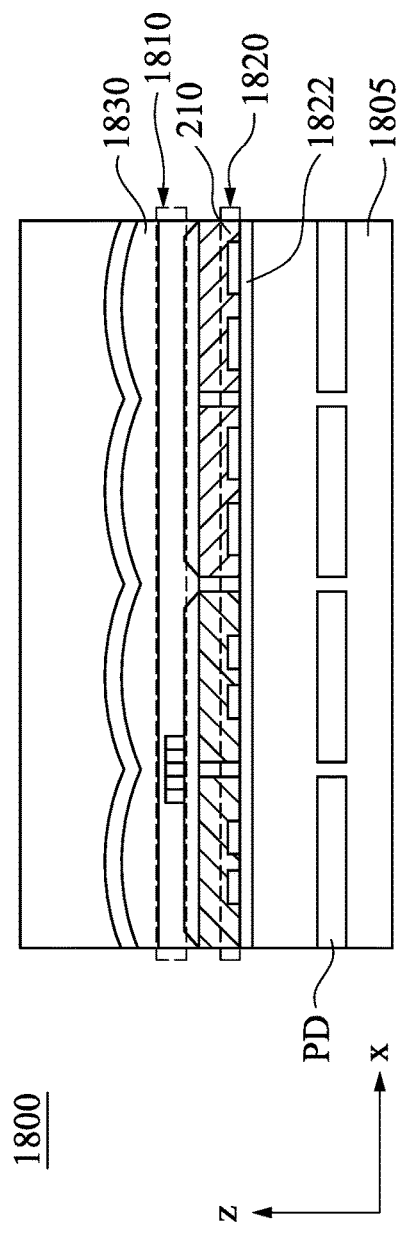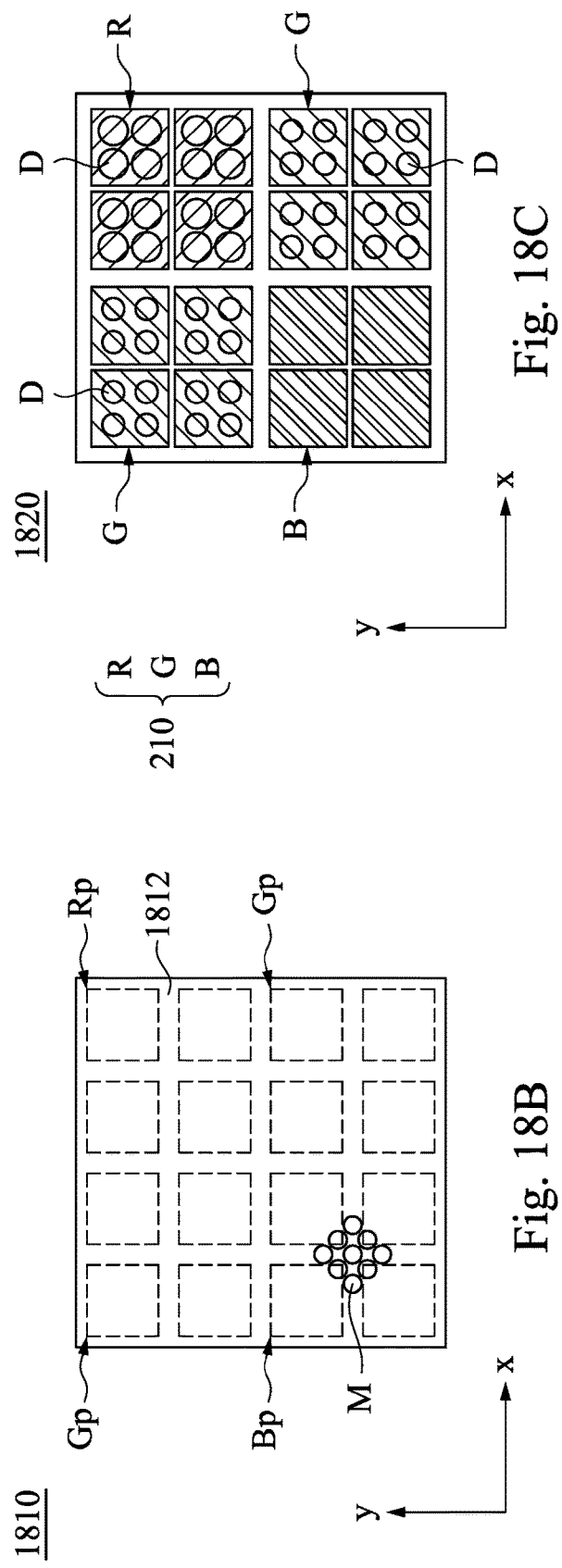

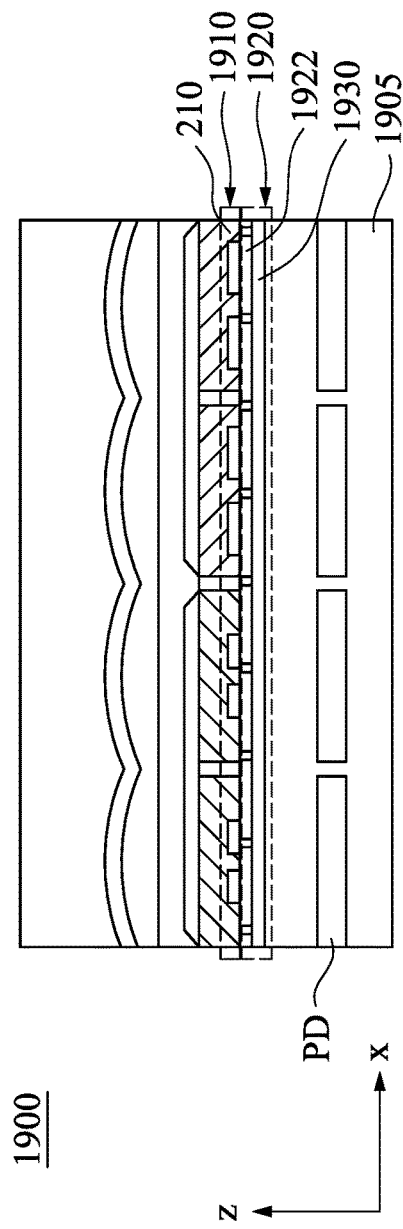
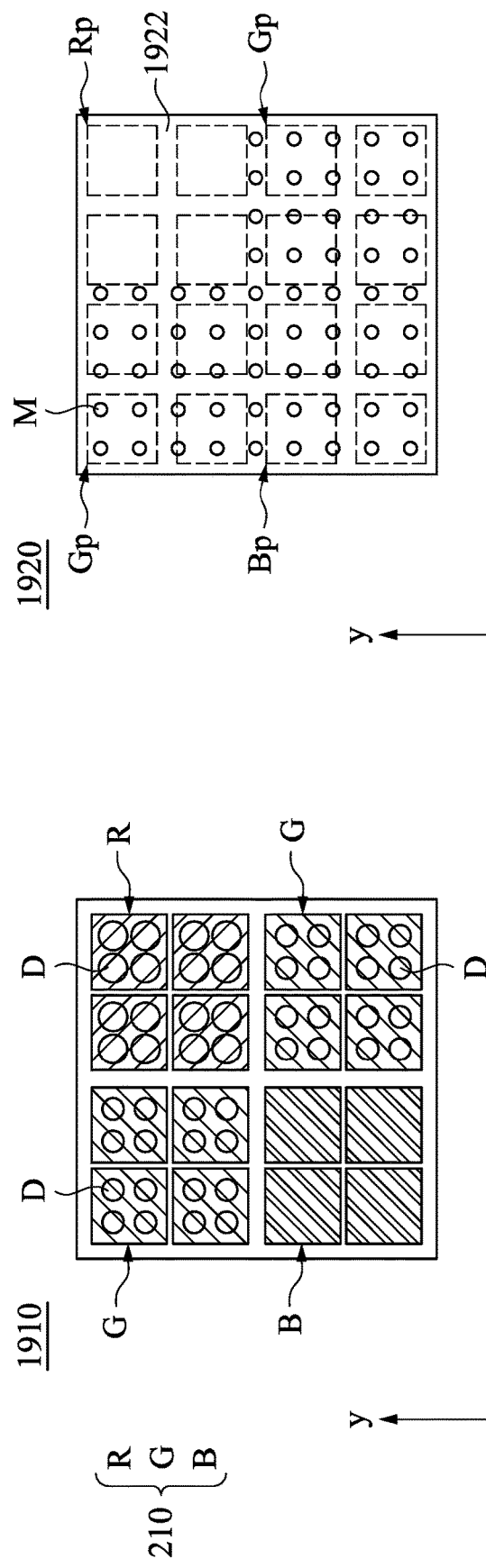

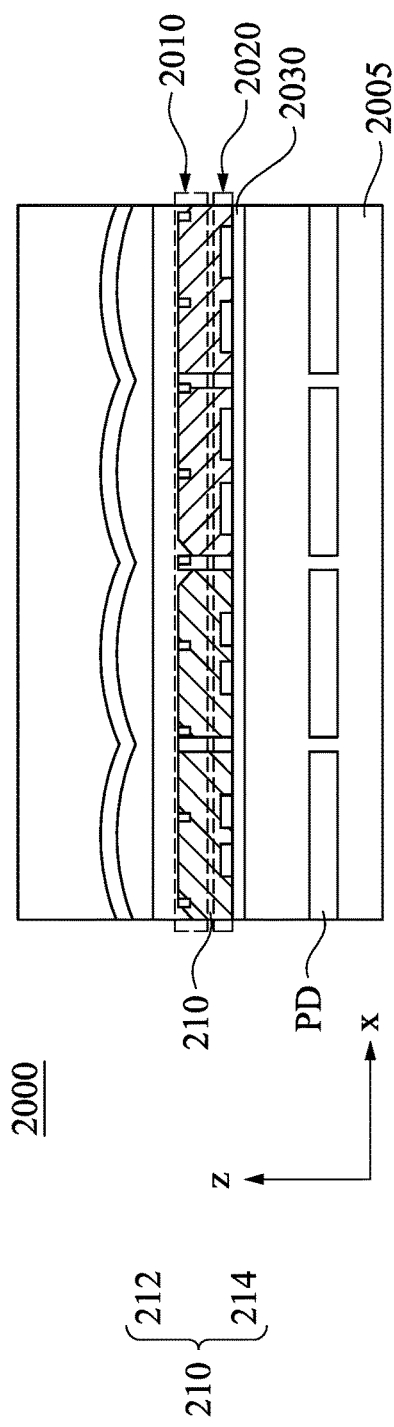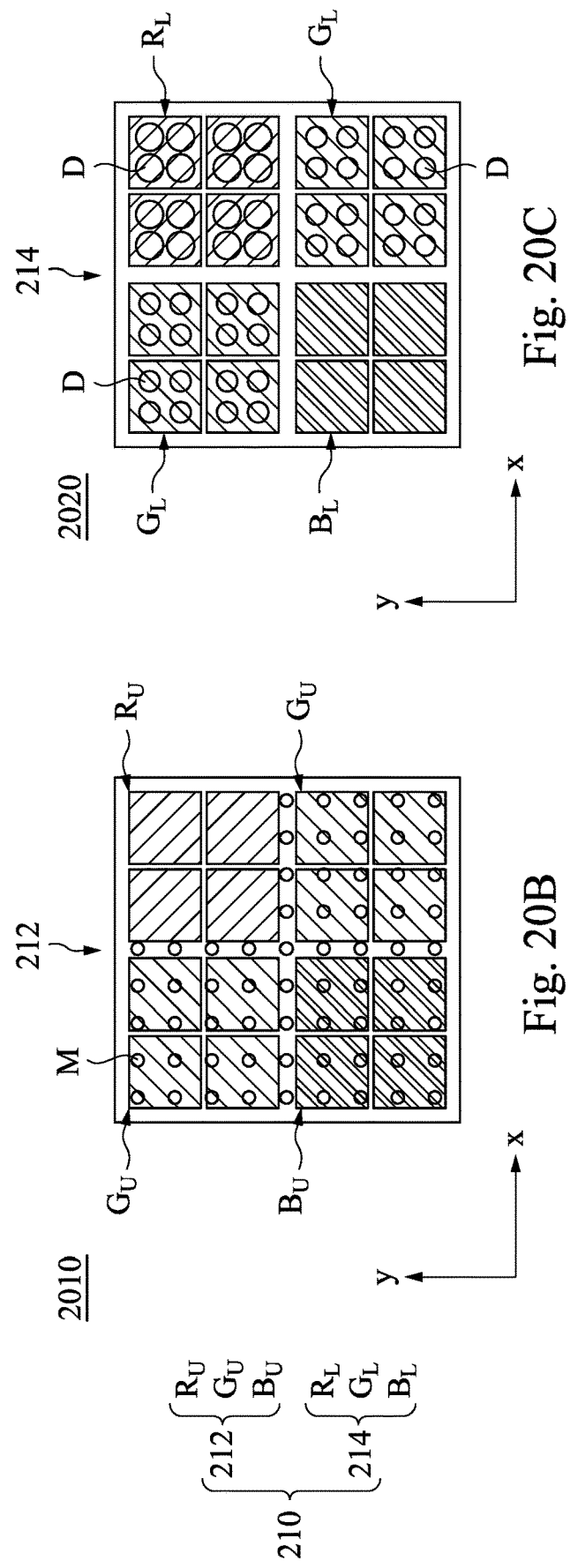
Fig. 20A
Fig. 20B
Fig. 20C

OPTICAL DEVICE

CROSS-REFERENCE TO RELATED APPLICATION

This application claims priority to U.S. Provisional Application Ser. No. 63/284,511, filed Nov. 30, 2021, which is herein incorporated by reference.

BACKGROUND

Field of Invention

The present disclosure relates to an optical device. More particularly, the present disclosure relates to the optical device having a hybrid absorber.

Description of Related Art

In the field of complementary metal oxide semiconductor (CMOS) image sensors (also could be referred to as CIS), a color filter layer could be used as an absorber with specific mosaic patterns to absorb a light with specific wavelengths band before the light propagates into image sensors (photodiodes) disposed under the color filter layer. It is understood that the thickness of the color filter layer has an impact on the light transmittance. For example, the color filter layer with a high thickness could provide relatively lower light transmittance than the color filter layer with a low thickness for filtering wavelength ranges.

However, even though the color filter with a high thickness could provide better CIS performances, it may be limited by fabrication feasibility in CIS. Therefore, there is a need to solve the above problems.

SUMMARY

One aspect of the present disclosure is to provide an optical device. The optical device includes a first photodiode, a second photodiode, and a hybrid absorber. The hybrid absorber is disposed above the first photodiode and the second photodiode. The hybrid absorber includes a color filter layer and a plurality of metal-insulator-metal structures. The color filter layer includes a first color filter disposed on the first photodiode and a second color filter disposed on the second photodiode, in which the first color filter is different from the second color filter. The plurality of metal-insulator-metal structures are disposed above the first photodiode and free of disposed above the second photodiode.

According to some embodiments of the present disclosure, the optical device further includes a near-infrared absorptive material, in which a portion of the near-infrared absorptive material is disposed between the color filter layer, the first photodiode, and the second photodiode.

According to some embodiments of the present disclosure, the plurality of metal-insulator-metal structures are disposed in the near-infrared absorptive material.

According to some embodiments of the present disclosure, the plurality of metal-insulator-metal structures are disposed in the color filter layer.

According to some embodiments of the present disclosure, the optical device further includes a lossless dielectric material disposed between the color filter layer, the first photodiode, and the second photodiode, in which the plurality of metal-insulator-metal structures are disposed in the lossless dielectric material.

According to some embodiments of the present disclosure, the plurality of metal-insulator-metal structures are arranged along a first circle with a radial distance L1 and a second circle with a radical distance L2, and the radical distance L1 is different from the radical distance L2. The number of the plurality of metal-insulator-metal structures in the first circle is a multiple of 4, and the number of the plurality of metal-insulator-metal structures in the second circle is a multiple of 4.

According to some embodiments of the present disclosure, the plurality of metal-insulator-metal structures in the first circle are evenly arranged along the first circle, and the plurality of metal-insulator-metal structures in the second circle are evenly arranged along the second circle.

According to some embodiments of the present disclosure, the number of the plurality of metal-insulator-metal structures in the first circle is different from the number of the plurality of metal-insulator-metal structures in the second circle.

According to some embodiments of the present disclosure, the optical device further includes an additional metal-insulator-metal structure arranged in a center of the first circle and the second circle.

According to some embodiments of the present disclosure, the optical device further includes a plurality of dielectric structures disposed adjacent to the plurality of metal-insulator-metal structures. The plurality of metal-insulator-metal structures are arranged along a first circle with a radical distance L1 and the plurality of dielectric structures are arranged along a second circle with a radical distance L2, and the radical distance L1 is different from the radical distance L2. The number of the plurality of metal-insulator-metal structures in the first circle is a multiple of 4, and the number of the plurality of dielectric structures in the second circle is a multiple of 4.

According to some embodiments of the present disclosure, the plurality of metal-insulator-metal structures in the first circle are evenly arranged along the first circle, and the plurality of dielectric structures in the second circle are evenly arranged along the second circle.

According to some embodiments of the present disclosure, the number of the plurality of metal-insulator-metal structures in the first circle is different from the number of the plurality of dielectric structures in the second circle.

According to some embodiments of the present disclosure, the optical device further includes an additional dielectric structure arranged in a center of the first circle and the second circle.

According to some embodiments of the present disclosure, the optical device further includes an additional metal-insulator-metal structure arranged in a center of the first circle and the second circle.

According to some embodiments of the present disclosure, the optical device further includes a third color filter and a plurality of dielectric structures. The third color filter is in the color filter layer. The third color filter is disposed on a third photodiode, and the third color filter is different from the first color filter and the second colorfilter. Each of the first, second, and third photodiodes correspond to different wavelength bands. The plurality of dielectric structures are arranged in a first array, disposed in the first color filter and the second color filter, and free of disposed in the third colorfilter. The plurality of metal-insulator-metal structures arranged in a second array.

According to some embodiments of the present disclosure, the optical device further includes a buffer layer disposed between the color filter layer, the first photodiode, the second photodiode, and the third photodiode.

According to some embodiments of the present disclosure, the plurality of metal-insulator-metal structures are disposed in the buffer layer.

According to some embodiments of the present disclosure, the optical device further includes a low-n layer disposed between the buffer layer and the color filter layer. The low-n layer has a refractive index between 1 and 1.8.

According to some embodiments of the present disclosure, the plurality of metal-insulator-metal structures are disposed in the low-n layer.

According to some embodiments of the present disclosure, the color filter layer includes an upper portion and a lower portion, the plurality of dielectric structures are disposed in the lower portion of the color filter layer, and the plurality of metal-insulator-metal structures are disposed in the upper portion of the color filter layer.

According to some embodiments of the present disclosure, the optical device further includes a third color filter, a plurality of dielectric structures, and an additional transparent layer. The third color filter is in the color filter layer. The third color filter is disposed on a third photodiode, and the third color filter is different from the first color filter and the second color filter. Each of the first, second, and third photodiodes correspond to different wavelength bands. The plurality of dielectric structures are arranged in a first array and disposed in the first color filter and the second color filter, and free of disposed in the third color filter. The additional transparent layer is disposed on the color filter layer, the plurality of metal-insulator-metal structures are disposed in the additional transparent layer and aggregate in a region.

According to some embodiments of the present disclosure, a projection of the region is in a center of one of the first, second, and third color filters.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4A, 4B, and 4C are schematic views of double-layer hybrid absorbers in accordance with some embodiments of the present disclosure.

FIGS. 5A, 5B and 5C are schematic views of double-layer hybrid absorbers in accordance with some embodiments of the present disclosure.

FIG. 15A is a top view of a single-layer hybrid absorber having a homo-cluster.

FIG. 15B is a cross-sectional view along a line A-A' in FIG. 15A.

FIG. 17A is a side view of a double-layer hybrid absorber.

FIG. 17B and FIG. 17C are top views of a first layer and a second layer in FIG. 17A.

FIG. 18A is a side view of a double-layer hybrid absorber.

FIG. 18B and FIG. 18C are top views of a first layer and a second layer in FIG. 18A.

FIG. 19A is a side view of a double-layer hybrid absorber.

FIG. 19B and FIG. 19C are top views of a first layer and a second layer in FIG. 19A.

FIG. 20A is a side view of a double-layer hybrid absorber.

FIG. 20B and FIG. 20C are top views of a first layer and a second layer in FIG. 20A.

DETAILED DESCRIPTION

Figure 1A:
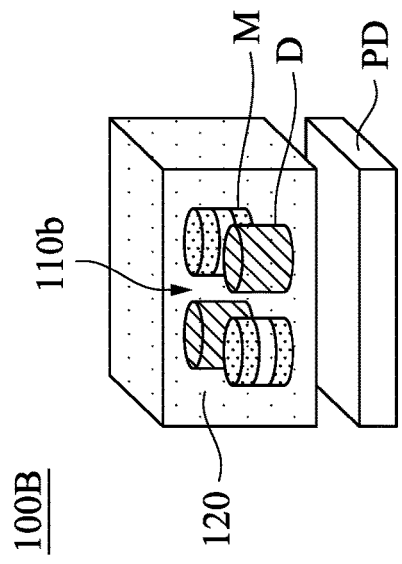
FIGS. 1A, 1B, 2A, and 2B are schematic views of single-layer hybrid absorbers in accordance with some embodiments of the present disclosure, in which clusters having non-periodic structures are disposed in the single-layer hybrid absorbers.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. It should be understood that the number of any elements/components is merely for illustration, and it does not intend to limit the present disclosure.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the embodiments. As used herein, the term "and/or" includes any and all combinations of one or more of the associated listed items.

Further, spatially relative terms, such as "beneath," "below," "lower," "above," "upper" and the like, may be used herein for ease of description to describe one element or feature's relationship to another element(s) or feature(s)

as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The optical device for complementary metal oxide semiconductor (CMOS) image sensors (CIS) of the present disclosure provides an ultrathin hybrid absorber for improving CIS applications in the small dimension pixel. The hybrid absorber herein may be referred to as a meta-absorber. The hybrid absorber has a color filter layer and a plurality of nanoparticles. The nanoparticles have a plurality of metal-insulator-metal (MIM) structures and/or a plurality of dielectric structures disposed within the hybrid absorber. The nanoparticles have the function of absorbing specific wavelength bands of the light. The light could be refracted or diffracted by the disclosed nanoparticles, and the optical paths of the light would be changed. Different structures and materials of nanoparticles correspond to different wavelength bands. In addition to the color filter layer that could absorb some wavelength bands, the plurality of MIM structures and dielectric structures could also absorb other wavelength bands. The position and arrangements of the nanoparticles would also affect the light transmittance. Furthermore, the ultrathin hybrid absorber of the present disclosure could have good CIS performance, but also would not be limited by fabrication feasibility in CIS.

The hybrid absorber of the present disclosure could be disposed as a single layer or a double layer. As a single-layer hybrid absorber, the plurality of nanoparticles are arranged together as a cluster which is non-periodic structures. As a double-layer hybrid absorber, it includes a first layer and a second layer stacking below the first layer, in which the plurality of nanoparticles could be disposed in the first layer or the second layer, and the first layer and/or the second layer are/is non-periodic structures (including homo-clusters $110a$ and hetero-clusters $110b$) and/or periodic structures (including first periodic arrays $410a$ and second periodic arrays $410b$).

It is understood that nanoparticles herein include a plurality of MIM structures and/or a plurality of dielectric structures. If a cluster only includes the plurality of MIM structures, the cluster could be referred to as a homo-cluster. If a cluster only includes the plurality of dielectric structures, the cluster could also be referred to as a "homo-cluster." If a cluster includes the plurality of MIM structures and the plurality of dielectric structures, the cluster could be referred to as a "hetero-cluster." In addition, the homo-cluster and/or the hetero-cluster could be disposed in the single-layer hybrid absorber and the double-layer hybrid absorber. It should be understood that the "cluster" described in the following discussions includes the homo-cluster $110a$ and/or the hetero-cluster $110b$ discussed below. Various embodiments of the hybrid absorber of the present disclosure will be described in detail below with the accompanying figures. It is understood that the schematic views of hybrid absorbers in FIG. 1A, 1B, 2A, 2B, 3A, 3B, 4A, 4B, 4C, 5A, 5B, 5C, 6A, and 6B merely illustrated for clarity to describe the positions of nanoparticles, and the actual arrangements of non-periodic structures (including homo-clusters $110a$ and hetero-clusters $110b$) and/or periodic structures (including first periodic arrays $410a$ and second periodic arrays $410b$) will be described in FIGS. 7A, 7B, 7C, 7D, 8A, 8B, 8C, 8D, 9A, 9B, 9C, 9D, 10A, 10B, 10C, 10D, 11A, 11B, 11C, 11D, 12A, 12B, 12C, 12D, 13A, 13B, 13C, 13D, 14A, 14B, 14C, and 14D.

Figure 1B:
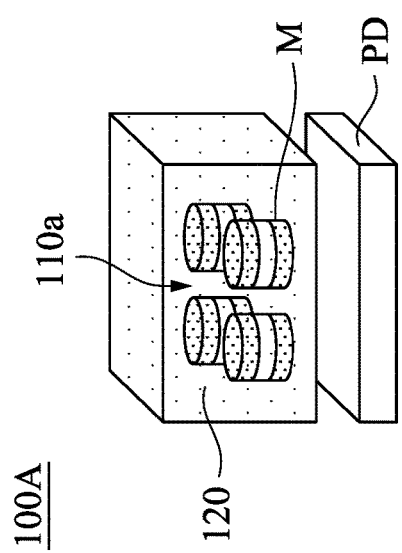

FIGS. 1A, 1B, 2A, and 2B are schematic views of single-layer hybrid absorbers 100A, 100B, 200A, 200B in accordance with some embodiments of the present disclosure, in which clusters $110a$, $110b$ having non-periodic structures are disposed in the single-layer hybrid absorbers 100A, 100B, 200A, 200B. Each of the single-layer hybrid absorbers 100A, 100B, 200A, 200B corresponds a pixel, and each pixel corresponds to a photodiode PD. Each photodiode PD is disposed below each of the single-layer hybrid absorbers 100A, 100B, 200A, 200B. In FIG. 1A, the single-layer hybrid absorber 100A includes a near-infrared absorptive material 120 and the homo-cluster $110a$ disposed in the near-infrared absorptive material 120. In FIG. 1B, the single-layer hybrid absorber 100B includes the near-infrared absorptive material 120 and a hetero-cluster $110b$ disposed in the near-infrared absorptive material 120. In some embodiments, the near-infrared absorptive material 120 includes a polymer that may absorb infrared light and/or visible light. In some embodiments, the near-infrared absorptive material 120 could be made by inorganic material or organic material. The inorganic material could be ITO, ATO, $LaB_6$, $MWO_3$ (M: Alkaline elements=(K, Tl, Rb, Cs). The organic material could be colorless polyimide (CPI) doped with diimmonium or dithiolene dyes, polyacrylate, cyclo olefin polymer (COP), polysulfone (PSU), and polystyrene (PS), and so on, but not limited to these medium.

Figure 2A:
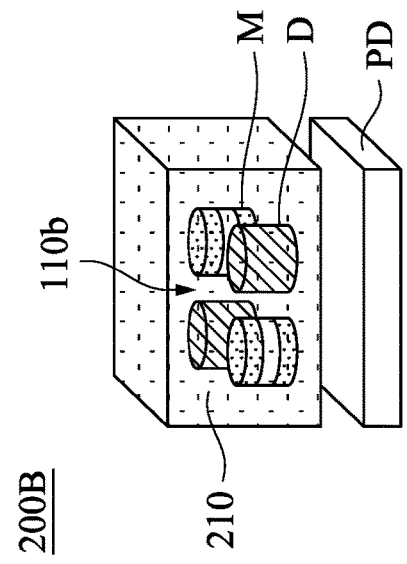
Figure 2B:
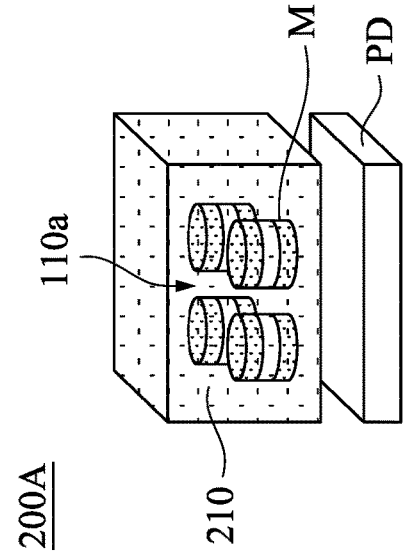

In FIG. 2A, the single-layer hybrid absorber 200A includes a color filter layer 210 and the homo-cluster $110a$ disposed in the colorfilter layer 210. In other words, the plurality of MIM structures M are disposed in the color filter layer 210. In FIG. 2B, the single-layer hybrid absorber 200B includes the color filter layer 210 and the hetero-cluster $110b$ disposed in the color filter layer 210. The homo-cluster $110a$ represents the plurality of MIM structures M and has non-periodic structures. The hetero-cluster $110b$ represents the plurality of MIM structures M and the dielectric structures D, and has non-periodic structures. In some embodiments, the MIM structures M may be $Al/SiO_2/Al$, $Cu/Al_2O_3/Cu$, $W/Al_2O_3/W$ or other suitable combinations. In some embodiments, the dielectric structures D may be made of $SiO_2$ (such as amorphous silicon, a-Si) or other suitable material.

Figure 3B:
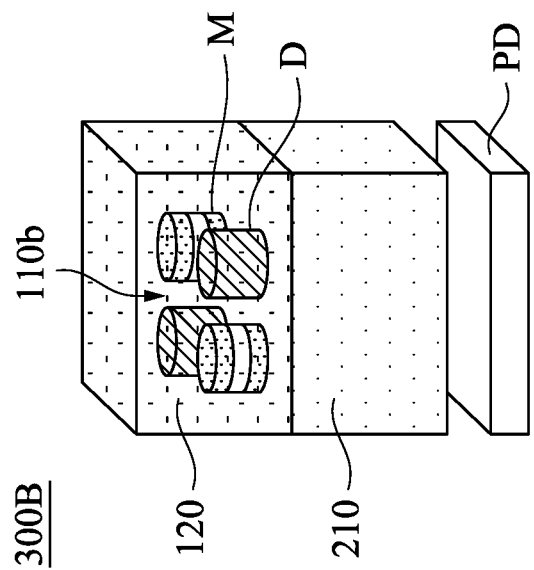
FIGS. 3A and 3B are schematic views of double-layer hybrid absorbers in accordance with some embodiments of the present disclosure, in which clusters having non-periodic structures are disposed in the double-layer hybrid absorbers.
Figure 3A:
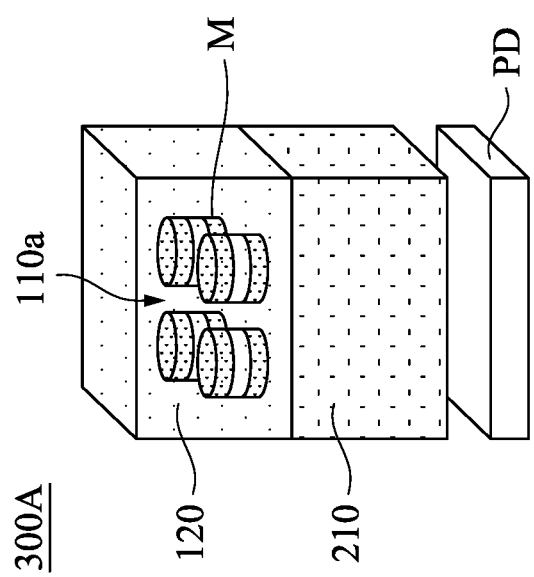

FIGS. 3A and 3B are schematic views of double-layer hybrid absorbers 300A, 300B in accordance with some embodiments of the present disclosure, in which clusters $110a$, $110b$ having non-periodic structures are disposed in the double-layer hybrid absorbers 300A, 300B. Each of the double-layer hybrid absorbers 300A, 300B corresponds a pixel, and each pixel corresponds to a photodiode PD. Each photodiode PD is disposed below each of the double-layer hybrid absorbers 300A, 300B. In FIG. 3A, the homo-cluster $110a$ is disposed in the near-infrared absorptive material 120, and the colorfilter layer 210 is disposed below the near-infrared absorptive material 120. In FIG. 3B, the hetero-cluster $110b$ is disposed in the near-infrared absorptive material 120, and the color filter layer 210 is disposed below the near-infrared absorptive material 120. In FIGS. 3A and 3B, it is noticed that there are no nanoparticles in the color filter layer 210.

FIGS. 4A, 4B, and 4C are schematic views of double-layer hybrid absorbers 400A, 400B, 400C in accordance with some embodiments of the present disclosure. Each of the double-layer hybrid absorbers 400A, 400B, 400C corresponds a pixel, and each pixel corresponds to a photodiode PD. Each photodiode PD is disposed below each of the double-layer hybrid absorbers 400A, 400B, 400C. In the double-layer hybrid absorbers 400A, 400B of FIGS. 4A and 4B, first periodic arrays 410a are disposed above second periodic arrays 410b. In the double-layer hybrid absorbers 400C of FIG. 4C, the first periodic array 410a is disposed below the second periodic array 410b. It is noticed that the homo-cluster 110a and the hetero-cluster 110b in FIGS. 1A, 1B, 2A, 2B, 3A, and 3B are non-periodic structures, and the first periodic arrays 410a and the second periodic arrays 410b in FIGS. 4A, 4B, and 4C (also in FIGS. 5A, 5B, and 5C below) are periodic arrays. In FIG. 4A, the color filter layer 210 is disposed below the near-infrared absorptive material 120, the first periodic array 410a is disposed in the near-infrared absorptive material 120, and the second periodic array 410b is disposed in the color filter layer 210. In FIG. 4B, the near-infrared absorptive material 120 is disposed below the color filter layer 210, the first periodic array 410a is disposed in the color filter layer 210, and the second periodic array 410b is disposed in the near-infrared absorptive material 120. In FIG. 4C, the color filter layer 210 is disposed below the near-infrared absorptive material 120, the second periodic array 410b is disposed in the near-infrared absorptive material 120, and the first periodic array 410a is in the color filter layer 210.

FIGS. 5A, 5B, and 5C are schematic views of double-layer hybrid absorbers 500A, 500B, 500C in accordance with some embodiments of the present disclosure. Each of the double-layer hybrid absorbers 500A, 500B, 500C corresponds a pixel, and each pixel corresponds to a photodiode PD. Each photodiode PD is disposed below each of the double-layer hybrid absorbers 500A, 500B, 500C. In the double-layer hybrid absorbers 500A, 500B of FIGS. 5A and 5B, hetero-clusters 110b are disposed above second periodic arrays 410b. In FIG. 5A, the color filter layer 210 is disposed below the near-infrared absorptive material 120, the hetero-cluster 110b is disposed in the near-infrared absorptive material 120, and the second periodic array 410b is disposed in the color filter layer 210. In FIG. 5B, the near-infrared absorptive material 120 is disposed below the color filter layer 210, the hetero-cluster 110b is disposed in the color filter layer 210, and the second periodic array 410b is disposed in the near-infrared absorptive material 120. In the double-layer hybrid absorber 500C of FIG. 5C, the color filter layer 210 is disposed below the near-infrared absorptive material 120, the hetero-cluster 110b is disposed in the near-infrared absorptive material 120, and the first periodic array 410a is disposed in the color filter layer 210.

Figure 6A:
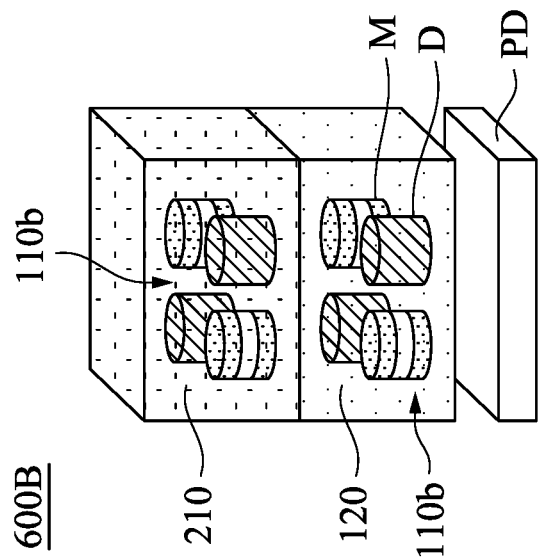
FIGS. 6A and 6B are schematic views of double-layer hybrid absorbers in accordance with some embodiments of the present disclosure.
Figure 6B:
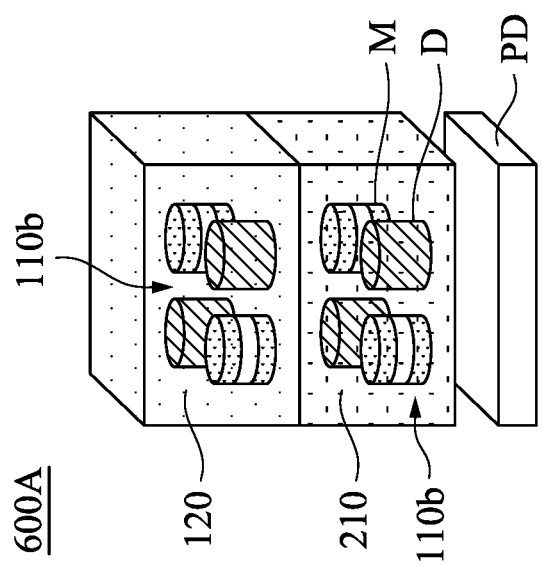

FIGS. 6A and 6B are schematic views of double-layer hybrid absorbers 600A, 600B in accordance with some embodiments of the present disclosure, in which clusters 110b are disposed above clusters 110b. Each of the double-layer hybrid absorbers 600A, 600B corresponds a pixel, and each pixel corresponds to a photodiode PD. Each photodiode PD is disposed below each of the double-layer hybrid absorbers 600A, 600B. In FIG. 6A, the color filter layer 210 is disposed below the near-infrared absorptive material 120, and each of the color filter layer 210 and the near-infrared absorptive material 120 has a hetero-cluster 110b. In FIG. 6B, the near-infrared absorptive material 120 is disposed below the color filter layer 210, and each of the color filter layer 210 and the near-infrared absorptive material 120 has a hetero-cluster 110b.

FIGS. 7A, 7C, 8A, 8C, 9A, 9C, 10A, and 10C are schematic views of various arrangements of homo-clusters 110a having non-periodic structures in hybrid absorbers 100A (see FIG. 1A), 200A (see FIG. 2A), 300A (see FIG. 3A) in accordance with some embodiments of the present disclosure. FIGS. 7B, 7D, 8B, 8D, 9B, 9D, 10B, and 10D are top views (xy-plane) of FIGS. 7A, 7C, 8A, 8C, 9A, 9C, 10A, and 10C, respectively. Specifically, the plurality of MIM structures M are arranged along a first circle with a radial distance L1 and a second circle with a radical distance L2. The radical distance L1 is different from the radical distance L2. The number of the MIM structures M in the first circle is a multiple of 4, and the number of the MIM structures M in the second circle is a multiple of 4. In some embodiments, the MIM structures M in the first circle are evenly arranged along the first circle, and the MIM structures M in the second circle are evenly arranged along the second circle. In some embodiments, the number of the MIM structures M in the first circle may be the same or different from the number of the MIM structures M in the second circle. In other words, in some embodiments, the number of the MIM structures M in the first circle may be less than or more than the number of the MIM structures M in the second circle. In addition, the medium around the MIM structures M could be the near-infrared absorptive material 120 or the color filter layer 210. The following will discuss various arrangements of homo-clusters 110a in detail.

Figure 7A:
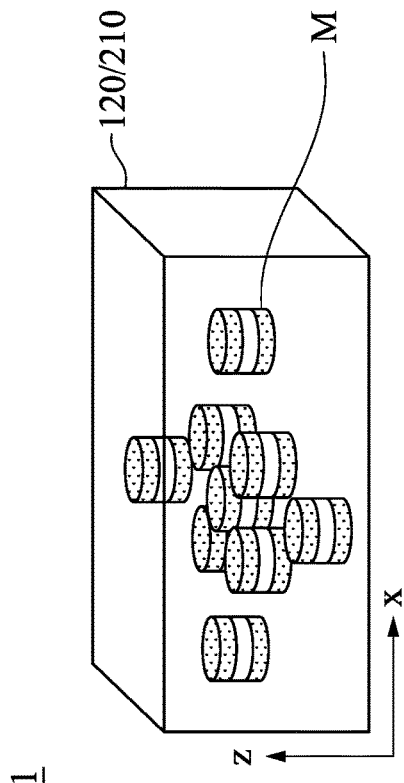
FIGS. 7A, 7C, 8A, 8C, 9A, 9C, 10A, and 10C are schematic views of various arrangements of homo-clusters having non-periodic structures in hybrid absorbers in accordance with some embodiments of the present disclosure.
Figure 7B:
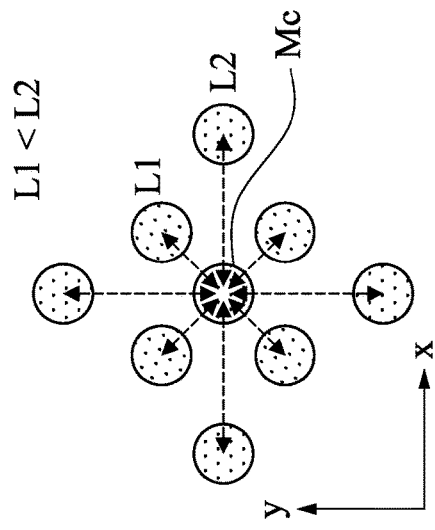
FIGS. 7B, 7D, 8B, 8D, 9B, 9D, 10B, and 10D are top views of FIGS. 7A, 7C, 8A, 8C, 9A, 9C, 10A, and 10C, respectively.
Figure 7C:
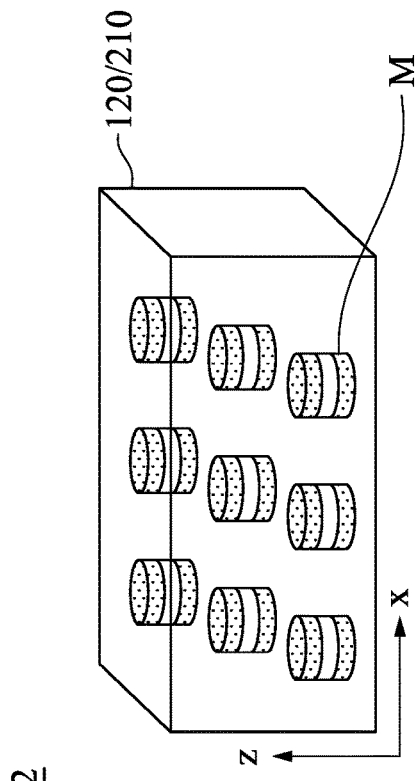
Figure 7D:
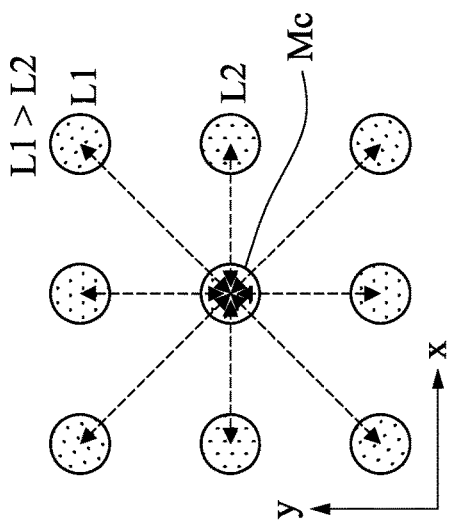

A homo-cluster 110a1 is illustrated in FIGS. 7A and 7B, and a homo-cluster 110a2 is illustrated in FIGS. 7C and 7D. The differences between the homo-cluster 110a1 and the homo-cluster 110a2 are that the homo-cluster 110a1 has the radial distance L1 smaller than the radical distance L2, and the homo-cluster 110a2 has the radial distance L1 greater than the radical distance L2. It is noticed that each of the homo-cluster 110a1 and the homo-cluster 110a2 has an additional MIM structure M (named "center MIM structure Mc") arranged in a center of the first circle and the second circle. In addition, the number of the MIM structures M in the first circle is 4, and the number of the MIM structures M in the second circle is also 4, as shown in the homo-cluster 110a1 and the homo-cluster 110a2.

Figure 8A:
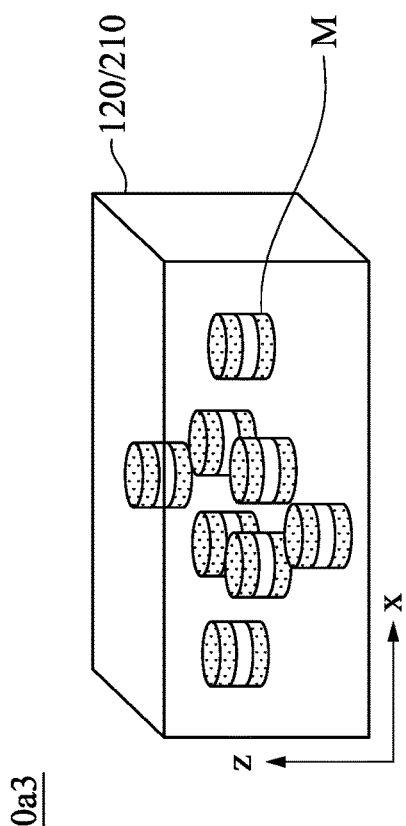
Figure 8B:
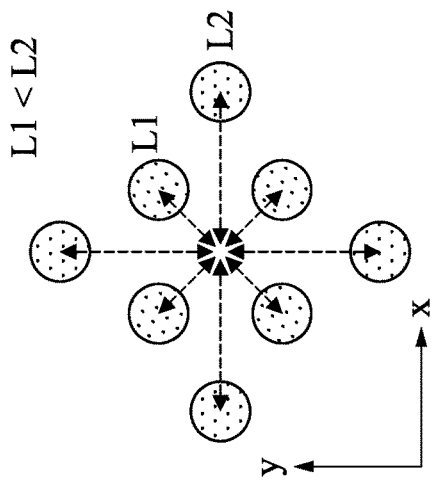
Figure 8C:
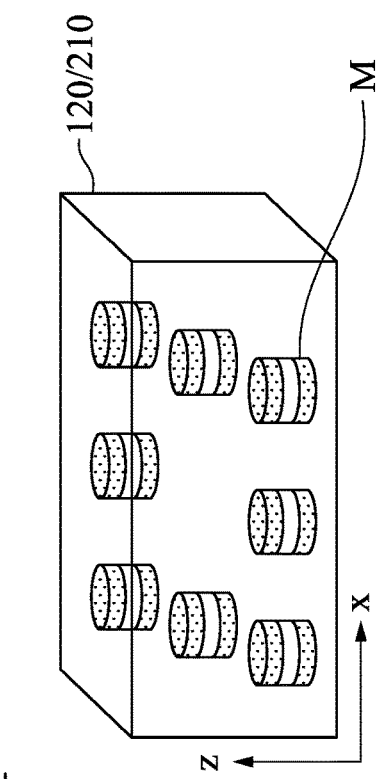
Figure 8D:
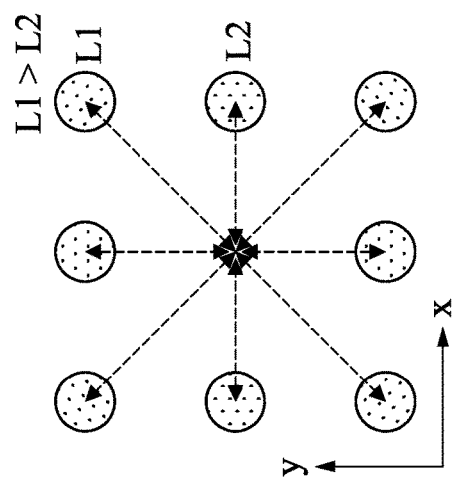

A homo-cluster 110a3 is illustrated in FIGS. 8A and 8B, and a homo-cluster 110a4 is illustrated in FIGS. 8C and 8D. The difference between the homo-cluster 110a1 and the homo-cluster 110a3 is the center MIM structure Mc. There is no center MIM structure Mc in the homo-cluster 110a3. Similarly, the difference between the homo-cluster 110a2 and the homo-cluster 110a4 is the center MIM structure Mc. There is no center MIM structure Mc in the homo-cluster 110a4.

Figure 9A:
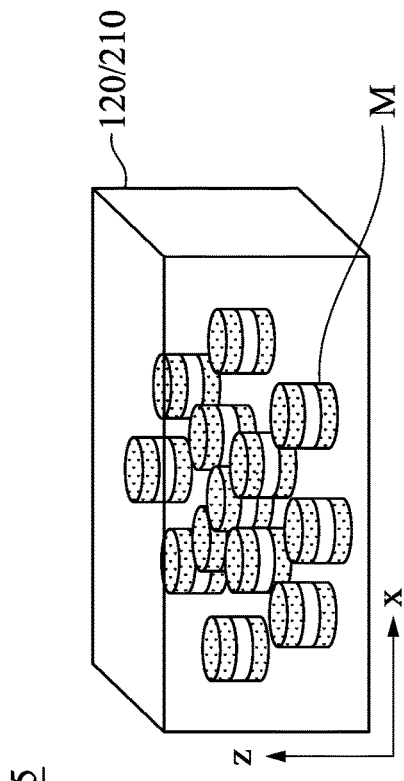
Figure 9B:
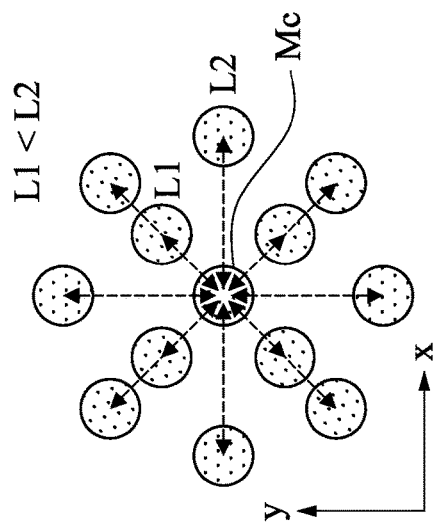
Figure 9C:
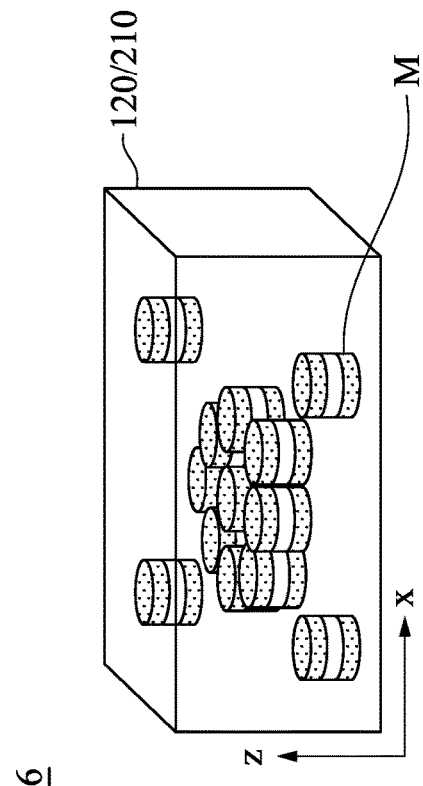
Figure 9D:
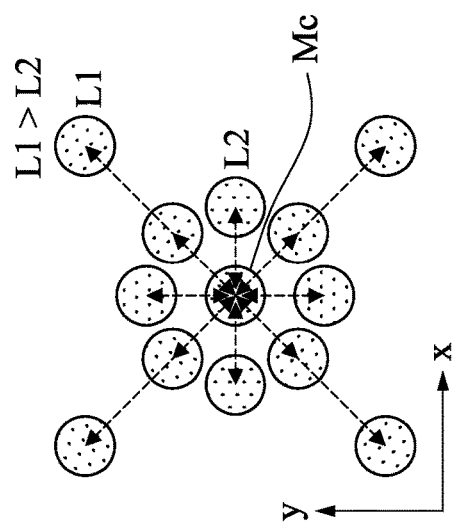

A homo-cluster 110a5 is illustrated in FIGS. 9A and 9B, and a homo-cluster 110a6 is illustrated in FIGS. 9C and 9D. The difference between the homo-cluster 110a1 and the homo-cluster 110a5 is the number of the MIM structures M in the second circle. In the homo-cluster 110a5, the number of the MIM structures M in the second circle is 8. Similarly, the difference between the homo-cluster 110a2 and the homo-cluster 110a6 is the number of the MIM structures M in the second circle. In the homo-cluster 110a6, the number of the MIM structures M in the second circle is 8.

Figure 10A:
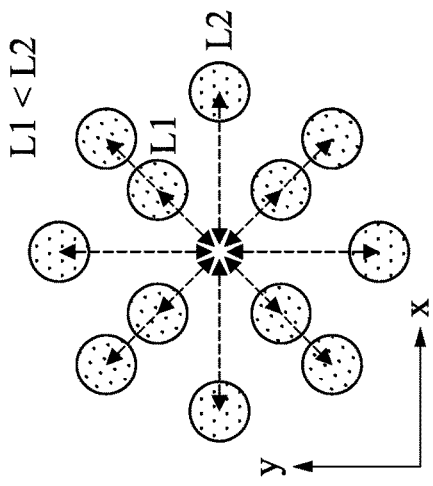
Figure 10B:
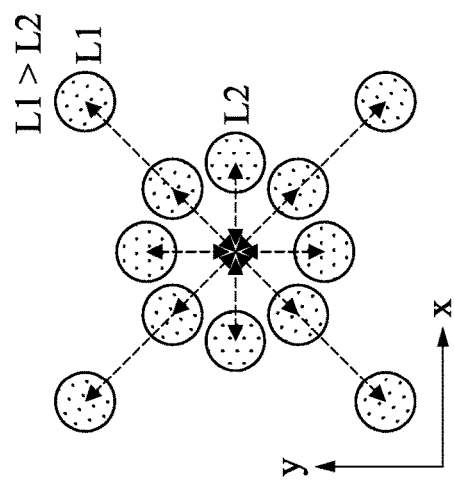
Figure 10C:
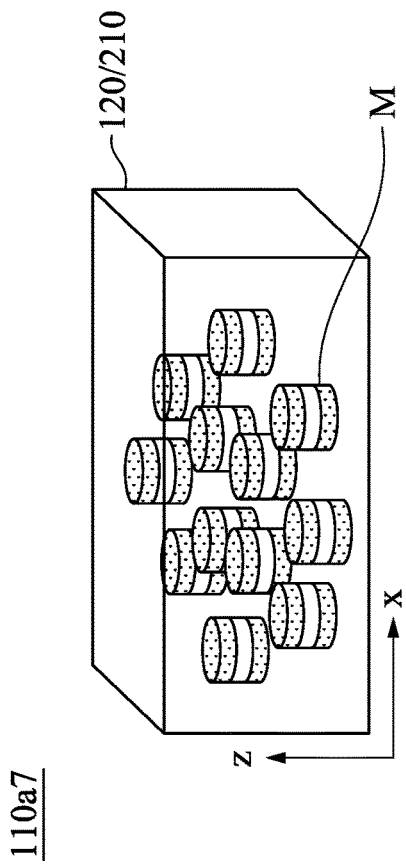
Figure 10D:
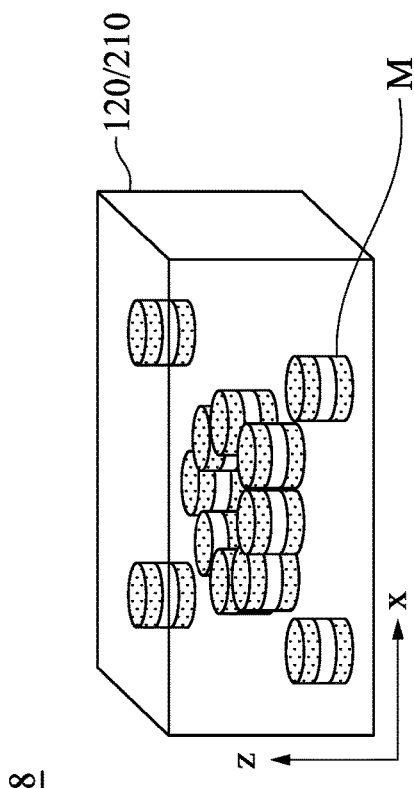

A homo-cluster 110a7 is illustrated in FIGS. 10A and 10B, and a homo-cluster 110a8 is illustrated in FIGS. 10C and 10D. The difference between the homo-cluster 110a5 and the homo-cluster 110a7 is the center MIM structure Mc. There is no center MIM structure Mc in the homo-cluster 110a7. Similarly, the difference between the homo-cluster 110a6 and the homo-cluster 110a8 is the center MIM structure Mc. There is no center MIM structure Mc in the homo-cluster 110a8.

FIGS. 11A, 11C, 12A, 12C, 13A, 13C, 14A, and 14C are schematic views of various arrangements of hetero-clusters 110*b* having non-periodic structures in hybrid absorbers 100B (see FIG. 1B), 200B (see FIG. 2B), 300B (see FIG. 3B), 500A (see FIG. 5A), 500B (see FIG. 5B), 500C (see FIG. 5C), 600A (see FIG. 6A), 600B (see FIG. 6B) in accordance with some embodiments of the present disclosure. FIGS. 11B, 11D, 12B, 12D, 13B, 13D, 14B, and 14D are top views (xy-plane) of FIGS. 11A, 11C, 12A, 12C, 13A, 13C, 14A, and 14C, respectively. Specifically, the plurality of dielectric structures D are disposed adjacent to the plurality of MIM structures M. The MIM structures M are arranged along a first circle with a radical distance L1 and the dielectric structures D are arranged along a second circle with a radical distance L2. The radical distance L1 is different from the radical distance L2. The number of the MIM structures M in the first circle is a multiple of 4, and the number of the dielectric structures D in the second circle is a multiple of 4. In some embodiments, the MIM structures M in the first circle are evenly arranged along the first circle, and the dielectric structures D in the second circle are evenly arranged along the second circle. In some embodiments, the number of the MIM structures M in the first circle may be the same or different from the number of the dielectric structures D in the second circle. In other words, in some embodiments, the number of the MIM structures M in the first circle may be less than or more than the number of the dielectric structures D in the second circle. In addition, the medium around the MIM structures M could be the near-infrared absorptive material 120 or the color filter layer 210. The following will discuss various arrangements of hetero-clusters 110*b* in detail.

Figure 11A:
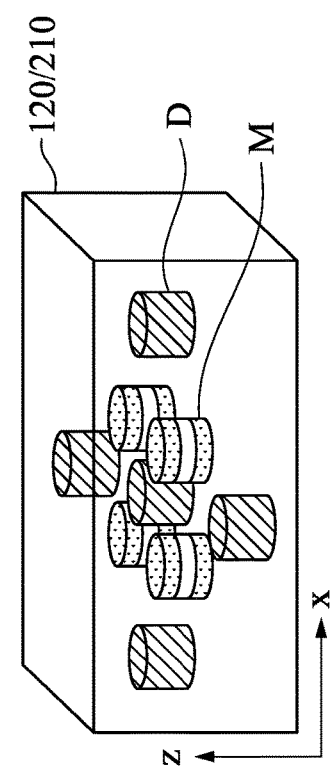
FIGS. 11A, 11C, 12A, 12C, 13A, 13C, 14A, and 14C are schematic views of various arrangements of hetero-clusters having non-periodic structures in hybrid absorbers in accordance with some embodiments of the present disclosure.
Figure 11B:
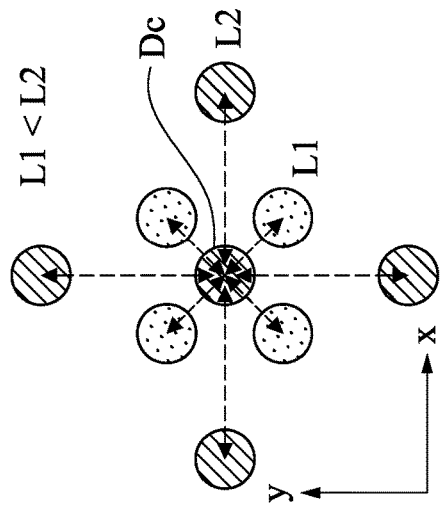
FIGS. 11B, 11D, 12B, 12D, 13B, 13D, 14B, and 14D are top views of FIGS. 11A, 11C, 12A, 12C, 13A, 13C, 14A, and 14C, respectively.
Figure 11C:
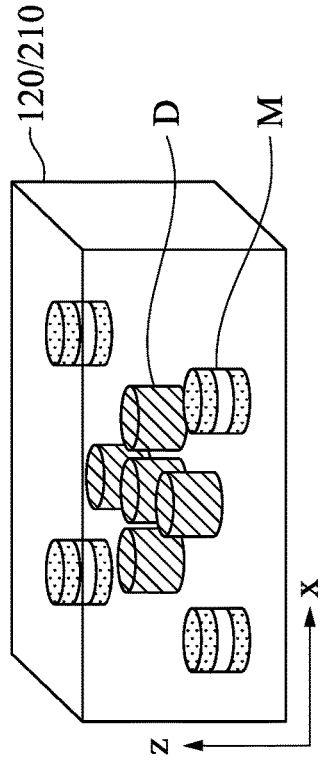
Figure 11D:
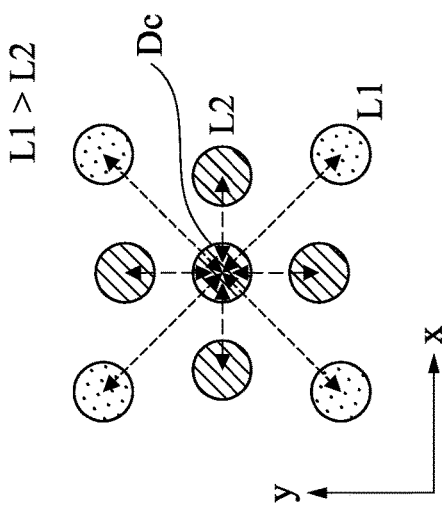

A hetero-cluster 110*b*1 is illustrated in FIGS. 11A and 11B, and a hetero-cluster 110*b*2 is illustrated in FIGS. 11C and 11D. The differences between the hetero-cluster 110*b*1 and the hetero-cluster 110*b*2 are that the hetero-cluster 110*b*1 has the radial distance L1 smaller than the radical distance L2, and the hetero-cluster 110*b*2 has the radial distance L1 greater than the radical distance L2. It is noticed that each of the hetero-cluster 110*b*1 and the hetero-cluster 110*b*2 has an additional dielectric structure D (named "center dielectric structure Dc") arranged in a center of the first circle and the second circle. In addition, the number of the MIM structures M in the first circle is 4, and the number of the dielectric structures D in the second circle is also 4, as shown in the homo-cluster 110*a*1 and the homo-cluster 110*a*2.

Figure 12A:
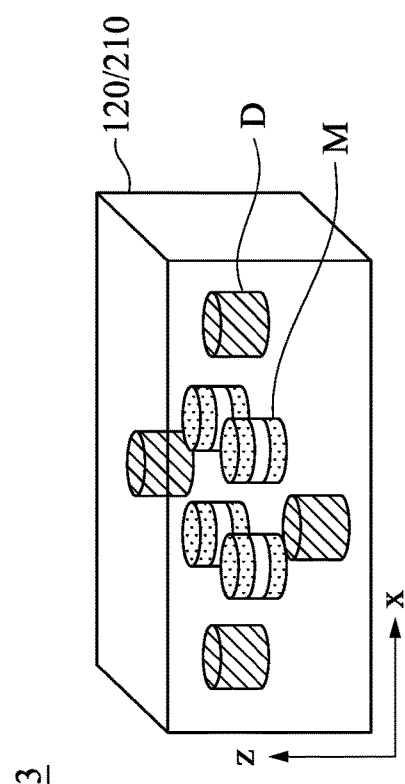
Figure 12B:
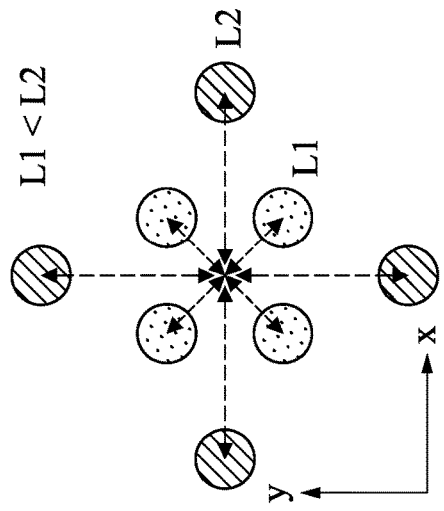
Figure 12C:
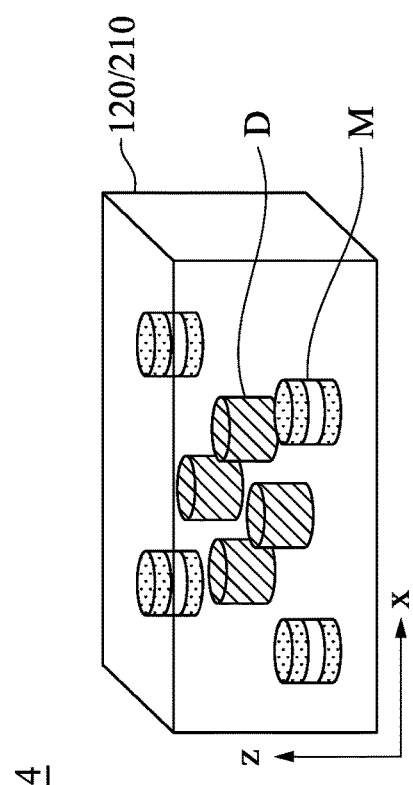
Figure 12D:
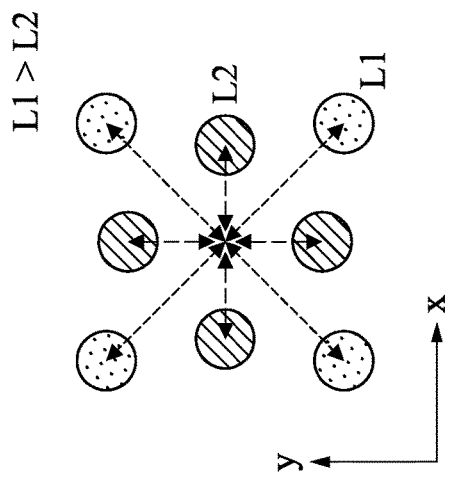

A hetero-cluster 110*b*3 is illustrated in FIGS. 12A and 12B, and a hetero-cluster 110*b*4 is illustrated in FIGS. 12C and 12D. The difference between the hetero-cluster 110*b*1 and the hetero-cluster 110*b*3 is the center dielectric structure Dc. There is no dielectric structure Dc in the hetero-cluster 110*b*3. Similarly, the difference between the hetero-cluster 110*b*2 and the hetero-cluster 110*b*4 is the center dielectric structure Dc. There is no center dielectric structure Dc in the hetero-cluster 110*b*4.

Figure 13A:
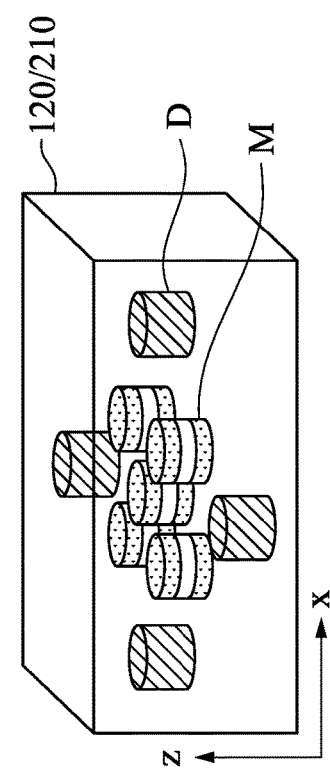
Figure 13B:
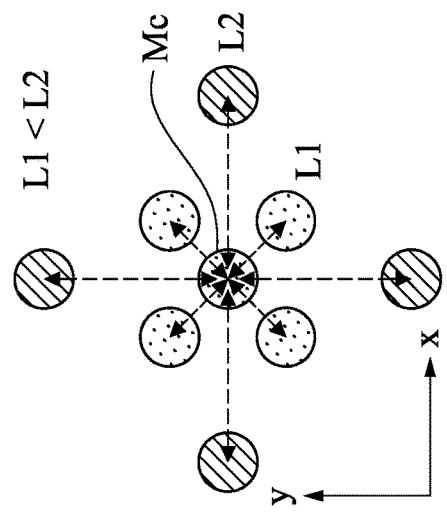
Figure 13C:
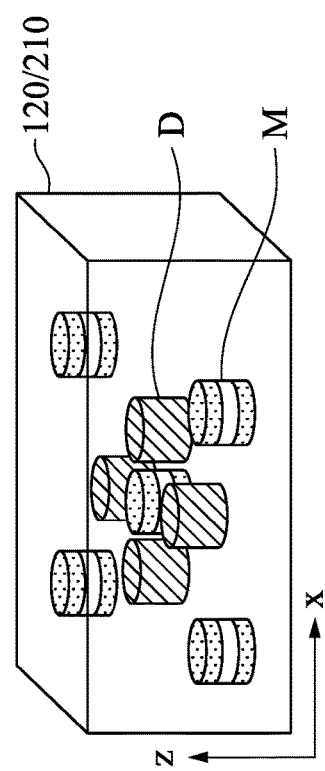
Figure 13D:
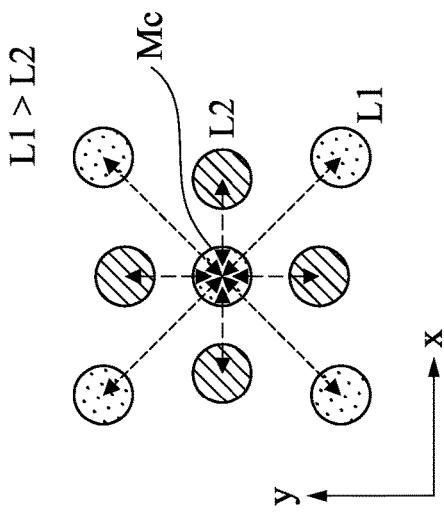

A hetero-cluster 110*b*5 is illustrated in FIGS. 13A and 13B, and a hetero-cluster 110*b*6 is illustrated in FIGS. 13C and 13D. The difference between the hetero-cluster 110*b*1 and the hetero-cluster 110*b*5 is the center nanoparticle of the first circle and the second circle. Each of the hetero-cluster 110*b*5 and the hetero-cluster 110*b*6 has the center MIM structures Mc in the center of the first circle and the second circle.

Figure 14A:
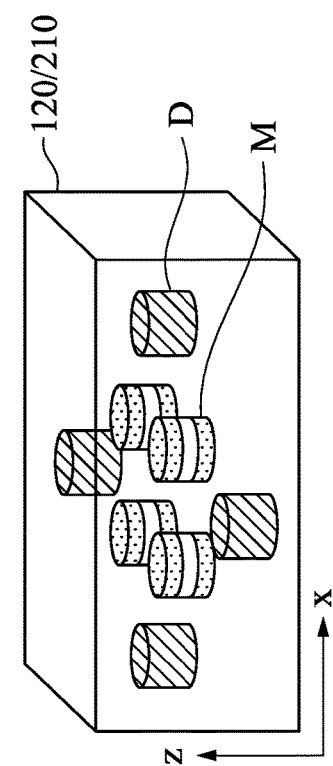
Figure 14B:
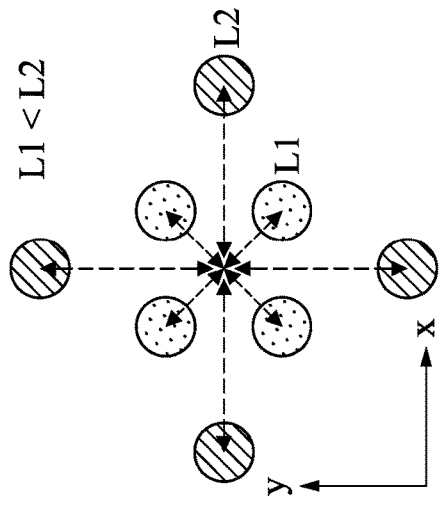
Figure 14C:
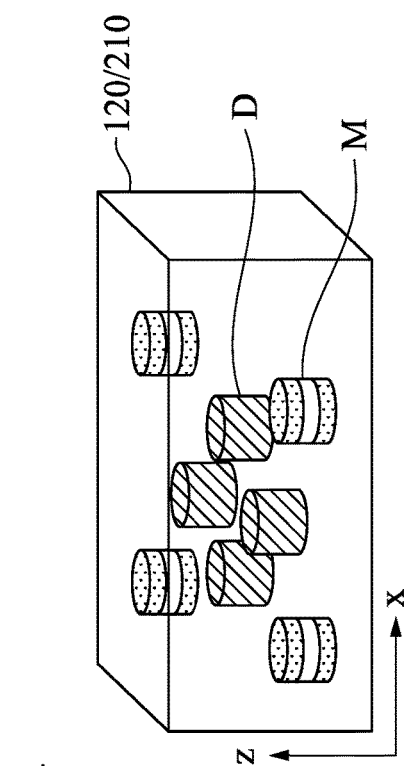
Figure 14D:
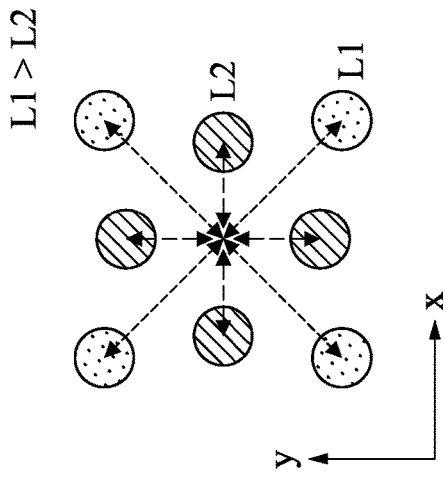

A hetero-cluster 110*b*7 is illustrated in FIGS. 14A and 14B, and a hetero-cluster 110*b*8 is illustrated in FIGS. 14C and 14D. The difference between the hetero-cluster 110*b*5 and the hetero-cluster 110*b*7 is the center MIM structure Mc. There is no MIM structure Mc in the hetero-cluster 110*b*7. Similarly, the difference between the hetero-cluster 110*b*6 and the hetero-cluster 110*b*8 is the center MIM structure Mc. There is no center MIM structure Mc in the hetero-cluster 110*b*8.

FIG. 15A is a top view (xy-plane) of a single-layer hybrid absorber 100A1 having the homo-cluster 110*a*. FIG. 15B is a cross-sectional view along a line A-A' in FIG. 15A. The hybrid absorber 100A1 includes a color filter layer 1510. As shown in FIG. 15A, a mosaic pattern of the color filter layer 1510 includes red color filters R, green color filters G, blue color filters B, and white color filters W (a kind of G, R, B, C pattern). The white color filter W herein is made of transparent material. Please refer to FIG. 15B, the near-infrared absorptive material 120 is disposed under the color filter layer 1510, the MIM structures M of the homo-cluster 110*a* are disposed in the near-infrared absorptive material 120, and a plurality of photodiodes PD are disposed below the near-infrared absorptive material 120. Each of the red color filter R, the green color filter G, the blue color filter B, and the white color filter W corresponds to a pixel. Each pixel corresponds to a photodiode PD. In other embodiments, the near-infrared absorptive material 120 in FIG. 15B could be replaced by a lossless dielectric material 122. The lossless dielectric material 122 is disposed between the color filter layer 1510 and the plurality of photodiodes PD. The plurality of MIM structures M are disposed in the lossless dielectric material 122. In some embodiments, the lossless dielectric material 122 could be the air.

Please refer to FIG. 15A and FIG. 8D, the arrangement of MIM structures M above each of the red filter layer R, the green filter layer G, and the blue filter layer B of the color filter layer 1510 in FIG. 15A is similar to the arrangement of the homo-cluster 110*a*4 illustrated in FIG. 8D. Compared to a hybrid absorber without nanoparticles (such as MIM structures M and/or dielectric structures D), the hybrid absorber 100A1 with the MIM structures M could absorb other wavelength bands, thereby achieving relatively low light transmittance. In other words, the hybrid absorber 100A1 with the MIM structures M could filter out some specific wavelength bands and so has good CIS performance. It is understood that a plurality of photodiodes PD is disposed below the hybrid absorber 100A1, and each of the photodiodes PD corresponds to different wavelength bands. A portion of the near-infrared absorptive material 120 is disposed between the color filter layer 1510 and the plurality of photodiodes PD.

Figure 16B:
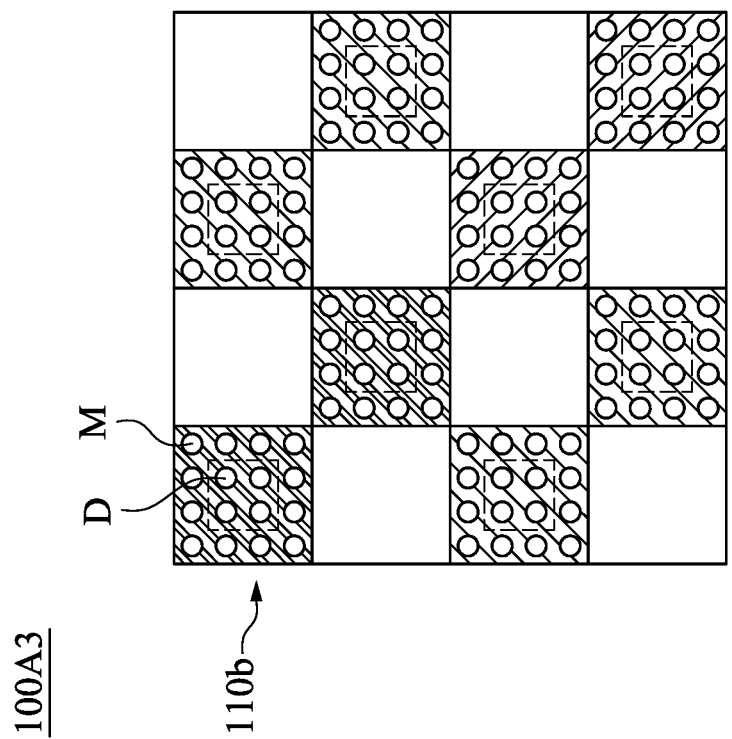
FIG. 16A and FIG. 16B are top views of alternative single-layer hybrid absorbers of the single-layer hybrid absorber in FIG. 15A.
Figure 16A:
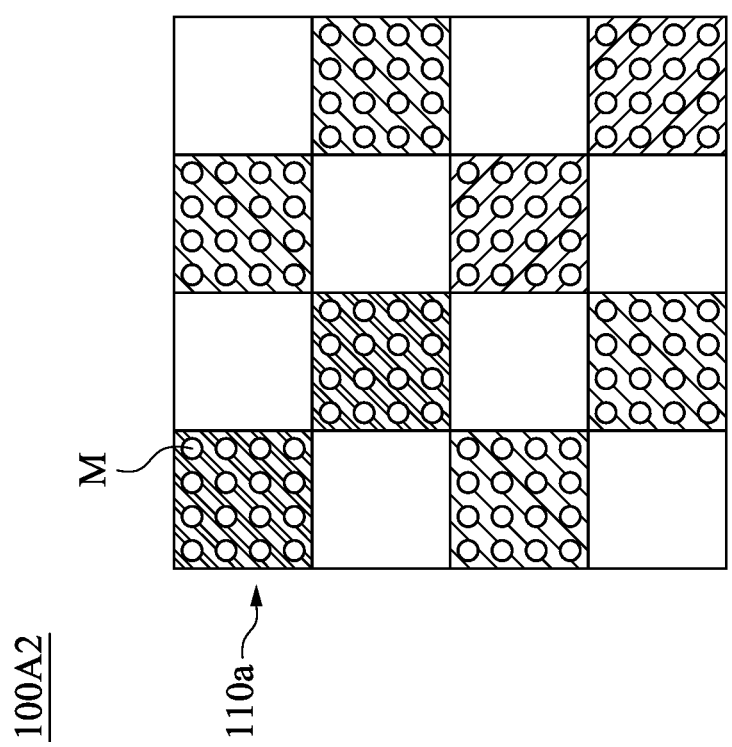

FIG. 16A and FIG. 16B are top views (xy-plane) of alternative single-layer hybrid absorbers 100A2, 100A3 of the single-layer hybrid absorber 100A1 in FIG. 15A. The difference between the hybrid absorbers 100A1, the hybrid absorber 100A2, and the hybrid absorbers 100A3 is nanoparticles (including the MIM structures M and/or the dielectric structures D). The hybrid absorber 100A2 includes the homo-cluster 110*a*, and the hybrid absorber 100A3 includes the hetero-cluster 110*b*. As shown in FIG. 16A, the arrangement of MIM structures M of the hybrid absorber 100A2 is a 4×4 array. In other embodiments, the arrangement of MIM structures M is a n×n array, in which n>1. As shown in FIG. 16B, the nanoparticles of the hybrid absorber 100A3 are also arranged in an array. However, the hybrid absorber 100A3 includes the MIM structures M and the dielectric structures D, in which the dielectric structures D are arranged in the form of a 2×2 array, and the MIM structures M are arranged around out of the dielectric structures D.

FIG. 17A is a side view of a double-layer hybrid absorber 1700. FIG. 17B and FIG. 17C are top views (xy-plane) of a first layer 1710 and a second layer 1720 in FIG. 17A. The double-layer hybrid absorber 1700 includes the first layer 1710 and the second layer 1720 disposed under the first layer 1710. A plurality of photodiodes PD are disposed below the second layer 1720. As shown in FIG. 17B, the first layer 1710 includes the color filter layer 210 (such as a Bayer filter). The color filter layer 210 includes a red color filter R, a green color filter G, and a blue color filter B. Each of the RGB includes 2×2 pixel array, and the number of the pixel array is not limited to the present disclosure. Each of the red color filter R, the green color filter G, and the blue color filter B corresponds to a pixel, and each pixel corresponds to one photodiode PD. The dielectric structures D are arranged in a periodic array. Specifically, the dielectric structures D are disposed in the red color filter R and the green pixel G, and free of disposed in the blue color filter B. As shown in FIGS. 17A and 17C, the second layer 1720 is between the first layer 1710 and the substrate 1705. The second layer 1720 includes a buffer layer 1722 and the MIM structures M disposed in the buffer layer 1722. A red projection Rp, a green projection Gp, and a blue projection Bp illustrated in FIG. 17C as dot lines represent projections of the red color filter R, the green color filter G, and the blue color filter B on the buffer layer 1722. The MIM structures M are arranged in a second periodic array. Specifically, the MIM structures M are free of disposed in the red projection Rp.

In some embodiments, the buffer layer 1722 is made of $SiO_2$. In some embodiments, the red colorfilter R is disposed on a first photodiode PD, the green color filter G is disposed on a second photodiode PD, the blue color filter B is disposed on a third photodiode PD, and each of the first, second, and third photodiodes PD correspond to different wavelength bands. The first, second, and third photodiodes PD are different from each other. In other words, as shown in FIG. 17A, the buffer layer 1722 is disposed between the color filter layer 210 (including the red color filter R, the green color filter G, and the blue color filter B), the first photodiode PD, the second photodiode PD, and the third photodiode PD. In some embodiments, a micro-lens 1730 is disposed above the first layer 1710. In some embodiments, the sizes of the dielectric structures D disposed in the red color filter R may be the same or different from the sizes of the dielectric structures D disposed in the green color filter G. In some embodiments, the sizes of the dielectric structures D disposed in the first layer 1710 may be the same or different from the sizes of the MIM structures M disposed in the second layer 1720.

It is understood that the dielectric structures D illustrated in FIG. 17B are free of disposed in the blue color filter B. However, other arrangements of the dielectric structures D are also in the present disclosure. For example, the dielectric structures D are free of disposed in the red color filter R, the green color filter G, or combinations thereof. Similarly, the MIM structures M illustrated in FIG. 17C are free of disposed in the red projection Rp. However, other arrangements of the MIM structures M are also in the present disclosure. For example, the MIM structures M are free of disposed in the green projection Gp, the blue projection Bp, or combinations thereof.

FIG. 18A is a side view of a double-layer hybrid absorber 1800. FIG. 18B and FIG. 18C are top views (xy-plane) of a first layer 1810 and a second layer 1820 in FIG. 18A. The double-layer hybrid absorber 1800 includes the first layer 1810 and the second layer 1820 disposed under the first layer 1810. A plurality of photodiodes PD are disposed below the second layer 1820. The second layer 1820 is between the first layer 1810 and the substrate 1805. The double-layer hybrid absorber 1800 includes a buffer layer 1822 disposed under the second layer 1820. As shown in FIG. 18C, the second layer 1820 may be similar to the first layer 1710 in FIG. 17B. Other arrangements of the dielectric structures D in FIG. 18C may be similar to various arrangements as discussed in FIG. 17B above and are not repeated herein. As shown in FIG. 18B, the plurality of MIM structures M (cluster) are disposed in the additional transparent layer 1812 and aggregated in a region. Specifically, a projection of the region is in the center of the blue projection Bp. As shown in FIG. 18A, the additional transparent layer 1812 is disposed on the color filter layer 210 (including the red color filter R, the green color filter G, and the blue color filter B). Each of the red color filter R, the green color filter G, and the blue color filter B corresponds to a pixel, and each pixel corresponds to one photodiode PD.

It is understood that the MIM structures M shown in FIG. 18B aggregate on the blue projection Bp. However, MIM structures M may aggregate on the red projection Rp and/or the green projection Gp. In some embodiments, the additional transparent layer 1812 may be made of transparent material, and a refractive index of the additional transparent layer 1812 may be smaller than or the same as a refractive index of a micro-lens 1830 (refer to FIG. 18A) disposed above the first layer 1810. The refractive index of a micro-lens 1830 is generally smaller than 2. In some embodiments, the material of the additional transparent layer 1812 is the same as the material of the micro-lens 1830. In some embodiments, the projection of the region of the plurality of MIM structures M may be in the center of one of the red color filter R, the green color filter G, and the blue color filter B.

FIG. 19A is a side view of a double-layer hybrid absorber 1900. FIG. 19B and FIG. 19C are top views (xy-plane) of a first layer 1910 and a second layer 1920 in FIG. 19A. The double-layer hybrid absorber 1900 includes the first layer 1910 and the second layer 1920 disposed under the first layer 1910. A plurality of photodiodes PD are disposed below the second layer 1920. The second layer 1920 is between the first layer 1910 and the substrate 1905. The first layer 1910 in FIG. 19B may be similar to the first layer 1710 in FIG. 17B. Other arrangements of the dielectric structures D in FIG. 19B may be similar to various arrangements as discussed in FIG. 17B above and are not repeated herein. As shown in FIG. 19A, a buffer layer 1930 is disposed under the second layer 1920, and the material of the buffer layer 1930 may be the same as the buffer layer 1722 in FIG. 17A. The double-layer hybrid absorber 1900 includes a low-n layer 1922 disposed under the first layer 1910. In other words, the low-n layer 1922 is disposed between the buffer layer 1930 and the color filter layer 210 of the first layer 1910. The low-n layer 1922 has the function of decreasing dark currents, so as to suppress optical noise. As shown in FIG. 19C, the MIM structures M are disposed in the low-n layer 1922. Other arrangements of the MIM structures M in FIG. 19C may be similar to various arrangements as discussed in FIG. 17C above and are not repeated herein. In some embodiments, a refractive index of the low-n layer 1922 is between 1 and 1.8, such as, 1.2, 1.4, or 1.6.

FIG. 20A is a side view of a double-layer hybrid absorber 2000. FIG. 20B and FIG. 20C are top views (xy-plane) of a first layer 2010 and a second layer 2020 in FIG. 20A. A plurality of photodiodes PD are disposed below the second layer 2020. In the double-layer hybrid absorber 2000 of FIG. 20A, the color filter layer 210 includes an upper portion 212 and a lower portion 214, the plurality of dielectric structures D are disposed in the lower portion 214 of the color filter layer 210 (as shown in FIG. 20C), and the plurality of MIM structures M are disposed in the upper portion 212 of the color filter layer 210 (as shown in FIG. 20B). The upper portion 212 of the color filter layer 210 includes an upper red color filter $R_U$, an upper green color filter $G_U$, and an upper blue color filter $B_U$, as shown in FIG. 20B. The lower portion 214 of the color filter layer 210 includes a lower red color filter $R_L$, a lower green color filter $G_L$, and a lower blue color filter $B_L$, as shown in FIG. 20C. As shown in FIG. 20A, the double-layer hybrid absorber 2000 further includes a buffer layer 2030 between the substrate 2005 and the second layer 2020. The material of the buffer layer 2030 in FIG. 20A may be the same as the buffer layer 1722 in FIG. 17A.

In the first layer 2010 of FIG. 20B, the MIM structures M are arranged in a first periodic array, in which the MIM structures M are disposed in the upper green color filter $G_U$ and the upper blue color filter $B_U$, and free of disposed in the upper red color filter $R_U$. In the second layer 2020 of FIG. 20C, the dielectric structures D are arranged in a second periodic array, in which the dielectric structures D are disposed in the lower green color filter $G_L$ and the lower red color filter $R_L$, and free of disposed in the lower blue color filter $B_L$. It is understood that the MIM structures M illustrated in FIG. 20B are free of disposed in the upper red color filter $R_U$. However, other arrangements of the MIM structures M are also in the present disclosure. For example, the MIM structures M are free of disposed in the upper green colorfilter $G_U$, the upper blue colorfilter $B_U$, or combinations thereof. Other arrangements of the dielectric structures D in FIG. 20C may be similar to various arrangements as discussed in FIG. 17B above and are not repeated herein.

The optical device of the present disclosure provides an ultrathin hybrid absorber (also be referred to as a metaabsorber) for improving CIS applications in the small dimension pixel. The hybrid absorber of the present disclosure could be disposed as a single layer or a double layer (a first layer and a second layer stacking below the first layer). Because the nanoparticles (including non-periodic structures (which are the homo-cluster 110a and/or the hetero-cluster 110b) and periodic arrays) in the hybrid absorber includes the plurality of MIM structures M and/or a plurality of dielectric structures D, the cluster can absorb specific wavelength bands of the light. The light could be refracted or diffracted by the disclosed nanoparticles, and the optical paths of the light would be changed. Therefore, in addition to the color filter layer that could absorb some wavelength bands, the plurality of MIM structures and dielectric structures could also absorb other wavelength bands. In addition, the ultrathin hybrid absorber of the present disclosure could provide low light transmittance and, therefore, have good CIS performance, but also would not be limited by fabrication feasibility in CIS.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An optical device, comprising:
   a substrate comprising sixteen photoelectrodes first; and
   a hybrid absorber disposed above the substrate, the hybrid absorber comprising:
   a color filter layer comprising four first color filters corresponding to four first photodiodes, four second color filters corresponding to four second photodiodes, and four third color filters corresponding to four third photodiodes, wherein the first color filter, the second color filter, and the third color filter are different from each other;
   a plurality of dielectric structures disposed in the four first color filters and the four second color filters and not disposed in the 4 third color filters; and
   a plurality of metal-insulator-metal structures disposed above the four first photodiodes and the four third photodiodes and not disposed above the four second photodiodes.

2. The optical device of claim 1,
   wherein the plurality of dielectric structures disposed in the four first color filters are arranged in a periodic array, and the plurality of dielectric structures disposed in the four second color filters are arranged in a periodic array.

3. The optical device of claim 1, further comprising a buffer layer disposed between the color filter layer and the substrate.

4. The optical device of claim 3, wherein the plurality of metal-insulator-metal structures are disposed in the buffer layer.

5. The optical device of claim 1, further comprising a low-n layer disposed between the color filter layer and the substrate,
   wherein the low-n layer has a refractive index between 1 and 1.8, and
   wherein the plurality of metal-insulator-metal structures are disposed in the low-n layer.

6. The optical device of claim 1, wherein the color filter layer comprises an upper portion and a lower portion, the plurality of dielectric structures are disposed in the lower portion of the color filter layer, and the plurality of metal-insulator-metal structures are disposed in the upper portion of the color filter layer.

7. The optical device of claim 4, wherein the plurality of metal-insulator-metal structures above the four first photodiodes and the four third photodiodes are arranged in a periodic array.

8. The optical device of claim 5, wherein the plurality of metal-insulator-metal structures above the four first photodiodes and the four third photodiodes are arranged in a periodic array.

9. The optical device of claim 1, wherein the four first photodiodes, the four second photodiodes, and the four third photodiodes correspond to different wavelength bands.

10. The optical device of claim 1, wherein the first color filter is a green color filter, the second color filter is a red color filter, and the third color filter is a blue color filter.

11. An optical device, comprising:
    a substrate comprising 16 photodiodes; and
    a hybrid absorber disposed above the substrate, the hybrid absorber comprising:
    a color filter layer comprising four first color filters corresponding to four first photodiodes, four second color filters corresponding to four second photodiodes, and four third color filters corresponding to four third photodiodes, wherein the first color filter, the second color filter, and the third color filter are different from each other;

a plurality of dielectric structures disposed in the four first color filters and the four second color filters and not disposed in the four third color filters; and an additional transparent layer disposed on the color filter layer, wherein a plurality of metal-insulator-metal structures are disposed in the additional transparent layer and aggregated in a region, and a projection of the region on the color filter layer is in a center of the four third color filters.

12. The optical device of claim 11, wherein the plurality of dielectric structures disposed in the four first color filters are arranged in a periodic array, and the plurality of dielectric structures disposed in the four second color filters are arranged in a periodic array.

13. The optical device of claim 11, wherein the four first photodiodes, the four second photodiodes, and the four third photodiodes correspond to different wavelength bands.

14. The optical device of claim 11, wherein the first color filter is a green color filter, the second color filter is a red color filter, and the third color filter is a blue color filter.

* * * * *